(12) United States Patent
Lee et al.

(10) Patent No.: US 8,050,012 B2
(45) Date of Patent: *Nov. 1, 2011

(54) MULTILAYER CHIP CAPACITOR AND CIRCUIT BOARD DEVICE INCLUDING THE SAME

(75) Inventors: Byoung Hwa Lee, Gyunggi-do (KR); Sung Kwon Wi, Seoul (KR); Hae Suk Chung, Seoul (KR); Dong Seok Park, Seoul (KR); Sang Soo Park, Gyunggi-do (KR); Min Cheol Park, Gyunggi-do (KR)

(73) Assignee: Samsung Electro-Mechanics Co., Ltd., Osaka (JP)

( * ) Notice: Subject to any disclaimer, the term of this patent is extended or adjusted under 35 U.S.C. 154(b) by 584 days.

This patent is subject to a terminal disclaimer.

(21) Appl. No.: 12/195,015

(22) Filed: Aug. 20, 2008

(65) Prior Publication Data

US 2009/0139757 A1    Jun. 4, 2009

(30) Foreign Application Priority Data

Nov. 30, 2007    (KR) .................. 10-2007-0123801

(51) Int. Cl.
*H01G 4/005*    (2006.01)
(52) U.S. Cl. .................. 361/303; 361/306.1; 361/306.3; 361/308
(58) Field of Classification Search .................. 361/303, 361/306.1–306.3, 312.1–321.2, 308–309
See application file for complete search history.

(56) References Cited

U.S. PATENT DOCUMENTS

| | | | |
|---|---|---|---|
| 5,880,925 A | | 3/1999 | DuPre et al. |
| 6,765,781 B2* | | 7/2004 | Togashi .................. 361/306.3 |
| 6,922,329 B2* | | 7/2005 | Togashi .................. 361/309 |
| 7,046,500 B2* | | 5/2006 | Lee et al. .................. 361/303 |
| 7,085,124 B2* | | 8/2006 | Togashi .................. 361/303 |
| 7,595,973 B1* | | 9/2009 | Lee et al. .................. 361/306.3 |
| 7,630,208 B2* | | 12/2009 | Lee et al. .................. 361/766 |
| 2006/0209492 A1 | | 9/2006 | Togashi |
| 2006/0279903 A1 | | 12/2006 | Togashi et al. |
| 2007/0096254 A1 | | 5/2007 | Ritter et al. |

FOREIGN PATENT DOCUMENTS

| | | |
|---|---|---|
| JP | 59-63429 | 4/1984 |
| JP | 59-225509 | 12/1984 |
| JP | 01-143208 | 6/1989 |

(Continued)

OTHER PUBLICATIONS

Korean Office Action issued in Korean Patent Application No. KR 10-2007-0123801, dated Mar. 6, 2009.

(Continued)

*Primary Examiner* — Tuan T Dinh
(74) *Attorney, Agent, or Firm* — McDermott Will & Emery LLP

(57) ABSTRACT

A multilayer chip capacitor including: a capacitor body having a lamination structure where a plurality of dielectric layers are laminated and including a first capacitor part and a second capacitor part arranged according to a lamination direction; first to fourth outer electrodes formed on side surfaces of the capacitor body, the first and third outer electrodes having the same polarity and the second and fourth outer electrodes having the same polarity opposite to that of the first outer electrode; and one or more connection conductor lines formed on an outer surface of the capacitor body and connecting the first outer electrode to the third outer electrode or connecting the second outer electrode to the fourth outer electrode.

33 Claims, 33 Drawing Sheets

FOREIGN PATENT DOCUMENTS

| | | |
|---|---|---|
| JP | 1-125528 | 8/1989 |
| JP | 04-105311 | 4/1992 |
| JP | 04-273416 | 9/1992 |
| JP | 06-333781 | 12/1994 |
| JP | 08-162368 | 6/1996 |
| JP | 08-265080 | 10/1996 |
| JP | 09-191184 | 7/1997 |
| JP | 11-040918 | 2/1999 |
| JP | 2001-052952 | 2/2001 |
| JP | 2001-185449 | 7/2001 |
| JP | 2001-203428 | 7/2001 |
| JP | 2003-060334 | 2/2003 |
| JP | 2004-014687 | 1/2004 |
| JP | 2004-247385 | 9/2004 |
| JP | 2004-273701 | 9/2004 |
| JP | 2006-203168 | 8/2006 |
| JP | 2006-261584 | 9/2006 |
| JP | 2007-129224 | 5/2007 |
| JP | 2007-142295 | 6/2007 |
| JP | 2007-165801 | 6/2007 |
| JP | 2007-250973 | 9/2007 |
| KR | 10-2006-0129951 | 12/2006 |
| KR | 10-0809238 | 2/2008 |

OTHER PUBLICATIONS

Japanese Decision of Rejection, w/ English translation thereof, issued in Japanese Patent Application No. JP 2008-210937 dated Mar. 8, 2011.

Japanese Office Action, w/ English translation thereof, issued in Japanese Patent Application No. JP 2008-210937 dated Aug. 31, 2010.

* cited by examiner

MULTILAYER CHIP CAPACITOR AND CIRCUIT BOARD DEVICE INCLUDING THE SAME

CROSS-REFERENCE TO RELATED APPLICATIONS

This application claims the priority of Korean Patent Application No. 2007-0123801 filed on Nov. 30, 2007, in the Korean Intellectual Property Office, the disclosure of which is incorporated herein by reference.

BACKGROUND OF THE INVENTION

1. Field of the Invention

The present invention relates to a multilayer chip capacitor, and more particularly, to a multilayer chip capacitor capable of having a controllable and high equivalent series resistance (ESR) and a low equivalent series inductance (ESL) and embodying uniform impedance characteristics in a wide frequency band and a circuit board device including the multilayer chip capacitor.

2. Description of the Related Art

Multilayer chip capacitors are generally used as decoupling capacitors for stabilizing a power supply circuit, such as power distribution networks of micro processing units (MPUs). Decoupling capacitors are used as low impedance current sources to suppress voltage noise due to simultaneous switching of MPUS.

As the MPU is increased in integration density, its current consumption is continuously increased and operating voltage is decreased. Accordingly, it becomes more difficult to suppress noise of a supply direct-current (DC) voltage according to a sudden change of a consumed current of an MPU. Recently, the consumed current is changed more rapidly with the increase in an operating frequency of the MPU. Accordingly, it is required to increase a capacitance and an ESR of a decoupling capacitor and reduce an ESL thereof. This is for maintaining magnitude of an impedance of a power distribution network to be low and uniform within the broadband frequency range. Ultimately, this is helpful to suppress noise of a supply DC voltage from a sudden change of a consumed current of an MPU.

To satisfy ESL characteristics required in decoupling capacitors used in an MPU power distribution network, changes to the arrangement of an outer electrode and a shape of an inner electrode of a capacitor have been provided. For example, U.S. Pat. No. 5,880,925 discloses a method of reducing an ESL by disposing leads of a first inner electrode and a second inner electrode in an interdigitated arrangement to form many and short current paths in the capacitor. This method is capable of reducing an ESL but entails a reduction of an ESR besides the ESL. Stability of a power supply circuit depends on not only an ESL but also an ESR. An excessively small ESR deteriorates the stability of a power supply circuit, thereby suddenly changing a voltage due to power network resonance. Such capacitor effectively reduces high frequency impedance. However, due to the excessively small ESR, it is difficult to maintain the magnitude of an impedance of a power distribution network to be low and uniform.

To overcome a problem of the excessively low ESR, there has been provided a method of embodying high ESR characteristics by using electrical high-resistance materials for an outer electrode or an inner electrode. However, when using high-resistance outer electrodes, it is difficult to prevent localized heat spots caused by a current concentration phenomenon due to pinholes in outer electrodes and to accurately control ESR. Also, when using high-resistance materials for inner electrodes, disadvantageously, high-resistant internal electrode materials should be changed with the improvement or change of ceramic materials since the high-resistant internal electrode materials should be matched with the ceramic materials, which leads to the increased cost of the products.

U.S. Patent Publication No. 2006/0209492 discloses a capacitor having a low impedance in a wide frequency band by disposing two capacitors having a different capacitance from each other in the same capacitor body. However, as disclosed, it is impossible to maintain an impedance to be uniform around each resonating frequency, thereby having a harmful effect on stability of a power supply circuit.

SUMMARY OF THE INVENTION

An aspect of the present invention provides a multilayer chip capacitor capable of maintaining magnitude of an impedance of a power distribution network to be uniform within a wide frequency band and a circuit board device including the multilayer chip capacitor.

According to an aspect of the present invention, there is provided a multilayer chip capacitor including: a capacitor body having a lamination structure where a plurality of dielectric layers are laminated and including a first capacitor part and a second capacitor part arranged according to a lamination direction; first to fourth outer electrodes formed on side surfaces of the capacitor body, the first and third outer electrodes having the same polarity and the second and fourth outer electrodes having the same polarity opposite to that of the first outer electrode; and one or more connection conductor lines formed on an outer surface of the capacitor body and connecting the first outer electrode to the third outer electrode or connecting the second outer electrode to the fourth outer electrode.

The first capacitor part includes first and second inner electrodes alternately disposed to be opposite to each other, interposing the dielectric layer therebetween in the capacitor body. The second capacitor part includes a plurality of third and fourth inner electrodes alternately disposed to be opposite to each other, interposing the dielectric layer therebetween in the capacitor body. The first outer electrode is connected to the first inner electrode, the second outer electrode is connected to the second inner electrode, the third outer electrode is connected to the third inner electrode, and the fourth outer electrode is connected to the fourth inner electrode.

A total number of a lamination of the third and fourth inner electrodes in the second capacitor part may be greater than a total number of a lamination of the first and second inner electrodes in the first capacitor part. An ESR (Equivalent Series Resistance) of the first capacitor part may be greater than an ESR of the second capacitor part. An ESL (Equivalent Series Inductance) of the first capacitor may be smaller than an ESL of the second capacitor part.

The first capacitor part may be located at one of both ends, such as a top end and a bottom end, of the lamination direction. In this case, the connection conductor line may be disposed at one of a top surface and a bottom surface vertical to the lamination direction of the capacitor body.

On the other hand, two of the first capacitor parts may be disposed at both ends of the lamination direction, and the second capacitor part may be disposed between the two first capacitor parts. In this case, the connection conductor line may be disposed at a top surface and a bottom surface of the capacitor body. Particularly, the first capacitors at the both ends may be symmetrically disposed to each other, and the multilayer chip capacitor may be have top and bottom symmetry.

The one or more connection conductor lines may include: a first connection conductor line connecting the first outer electrode to the third outer electrode; and a second connection conductor line connecting the second outer electrode to the fourth outer electrode. As another example, the first outer electrode and the third outer electrode may be connected to each other by the connection conductor line but the second outer electrode may not be connected to the fourth outer electrode by the connection conductor line. As another example, the second outer electrode and the fourth outer electrode may be connected to each other by the connection conductor line but the first outer electrode may not be connected to the third outer electrode by the connection conductor line.

The first capacitor part may be connected to the second capacitor part in parallel by the connection conductive line connecting the outer electrodes having the same polarity, and the connection conductor line may be connected in series to the second capacitor part. A resistance directly added to the second capacitor part may be adjusted by changing conductivity of the connection conductor line. Also, the resistance directly added to the second capacitor part may be adjusted by changing a length, a width, and a thickness of the connection conductor line. The connection conductor line may be formed of a thick-film resistor by using screen printing or may be formed of a thin-film resistor by using sputtering.

The multilayer chip capacitor may be a four-terminal capacitor including the first to fourth outer electrodes one by one, respectively.

The first and second outer electrodes may be disposed at shorter side surfaces of the capacitor body, opposite to each other, and the third and fourth outer electrodes may be disposed at longer side surfaces of the capacitor body, opposite to each other.

The first and second outer electrodes may be disposed at longer side surfaces of the capacitor body, opposite to each other, and the third and fourth outer electrodes may be disposed at shorter side surfaces of the capacitor body, opposite to each other.

The first and second inner electrodes may be connected to the first and second outer electrodes via leads, respectively. An ESR of the first capacitor part may be controlled by changing widths of the leads of the first and second inner electrodes. The third and fourth inner electrodes may be connected to the third and fourth outer electrodes via leads, respectively. An ESR of the second capacitor part may be controlled by changing widths of the leads of the third and fourth inner electrodes.

According to another aspect of the present invention, there is provided a circuit board device including: the multilayer chip capacitor of claim 1; and a circuit board including a mounting surface where the multilayer chip capacitor is mounted and an external circuit electrically connected to the multilayer chip capacitor. A plurality of pads connected to the outer electrodes of the multilayer chip capacitor is formed and the first capacitor part is disposed to be closer to the mounting surface than the second capacitor part in the multilayer chip capacitor. An ESR of the first capacitor part may be greater than an ESR of the second capacitor part.

The plurality of pads includes a first pad connected to the first outer electrode and a second pad connected to the second outer electrode, and the first and second pads are directly connected to the external circuit.

Vias connected to the first and second pads may be formed in the circuit board, as a portion of the external circuit. To reduce a current loop size flowing through the first capacitor part via the first and second pads, the via connected to the first pad may be disposed adjacent to the second pad, and the via connected to the second pad may be disposed adjacent to the first pad. Two or more of the vias may be connected to each of the first and second pads, respectively.

The one or more of connection conductor lines may include a first connection conductor line connecting the first outer electrode to the third outer electrode and a second connection conductor line connecting the second outer electrode to the fourth outer electrode. In this case, the third and fourth outer electrodes may be connected to the external circuit via the first and second connection conductor lines. Also, the plurality of pads may further include a third pad connected to the third outer electrode and a fourth pad connected to the fourth outer electrode.

The one or more connection conductor lines may include only one of a first connection conductor line connecting the first outer electrode to the third outer electrode and a second connection conductor line connecting the second outer electrode to the fourth outer electrode.

For example, the one or more connection conductor lines may include only the first connection conductor line, the plurality of pads may further include a pad connected to the fourth outer electrode, and the pad connected to the fourth outer electrode may be directly connected to the external circuit. In this case, vias connected to the pad connected to the fourth outer electrode, the first pad, and the second pad may be formed in the circuit board, as a portion of the external circuit.

On the other hand, the one or more connection conductor lines may include only the second connection conductor line, the plurality of pads may further include a pad connected to the third outer electrode, and the pad connected to the third outer electrode may be directly connected to the external circuit. In this case, vias connected to the pad connected to the third outer electrode, the first pad, and the second pad may be formed in the circuit board, as a portion of the external circuit.

The multilayer chip capacitor mounted on the circuit board may have impedance characteristics having a flat portion in a frequency-impedance curve.

According to an exemplary embodiment of the present invention, there is provided a multilayer chip capacitor capable of embodying a low ESL and maintaining a suitable ESR. When applying the multilayer chip capacitor to a decoupling application, it is possible to maintain an impedance of a power distribution network to be low and uniform within a wide frequency band, thereby providing a decoupling capacitor with a high and controllable ESR and a low ESL.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art.

Figure 1:
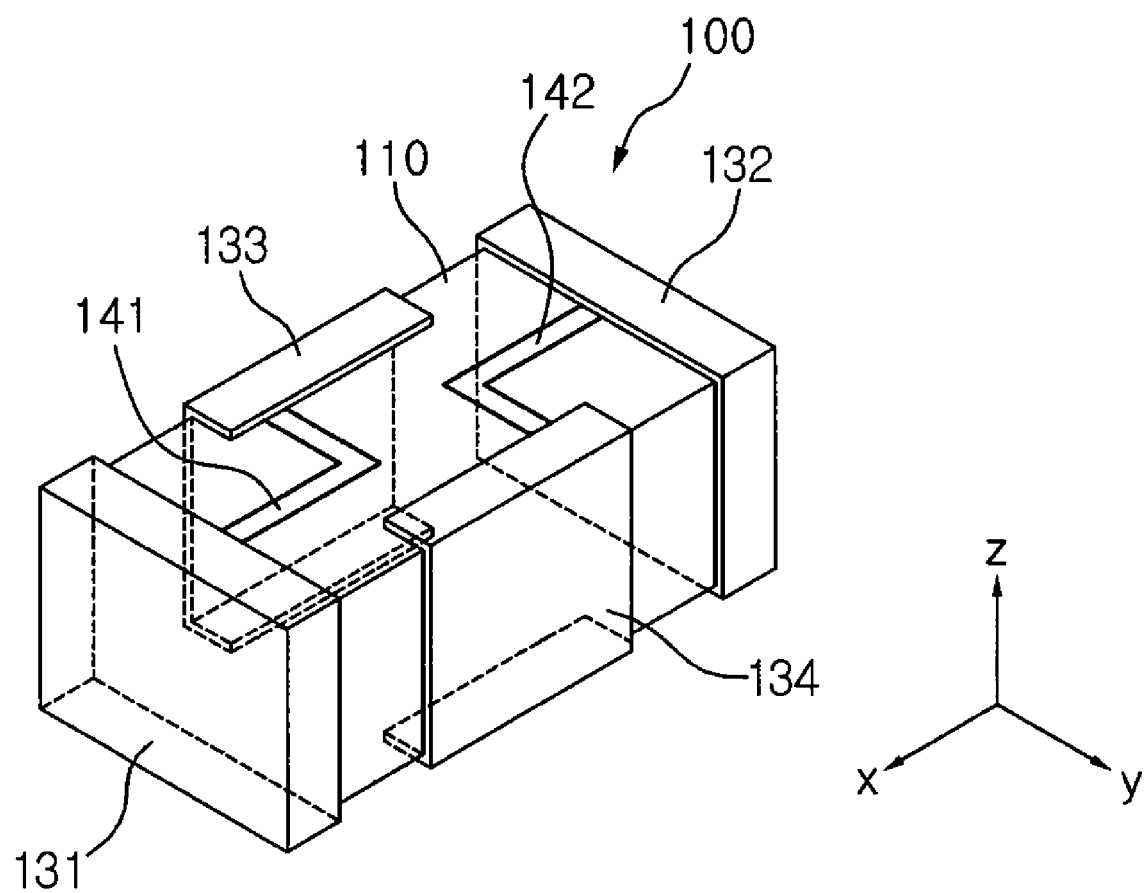
FIG. 1 is a perspective view illustrating an external shape of a multilayer chip capacitor according to an embodiment of the present invention.
Figure 2A:
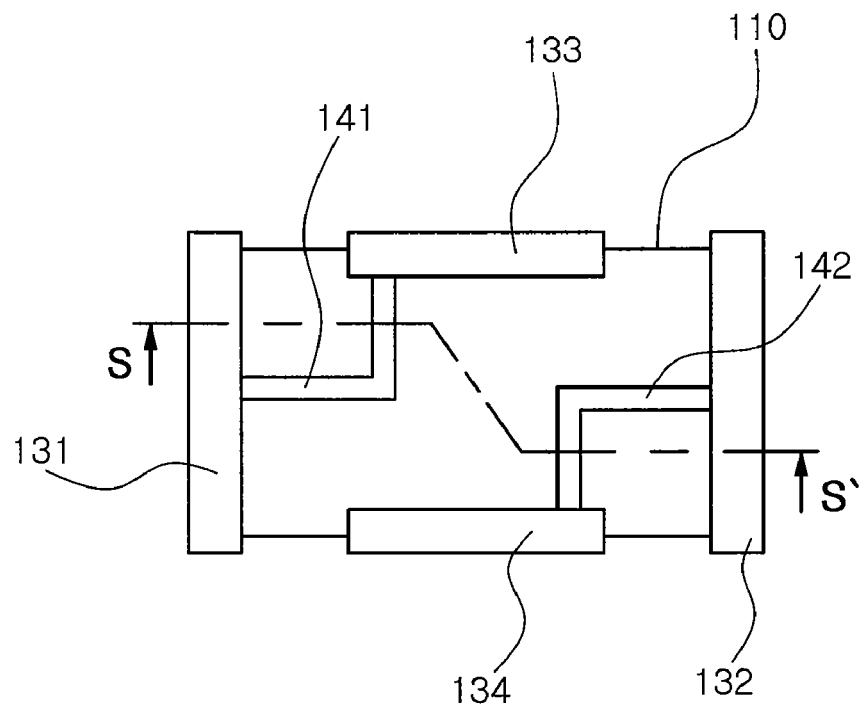
FIGS. 2A and 2B are a top view and a bottom view illustrating the multilayer chip capacitor of FIG. 1.
Figure 2B:
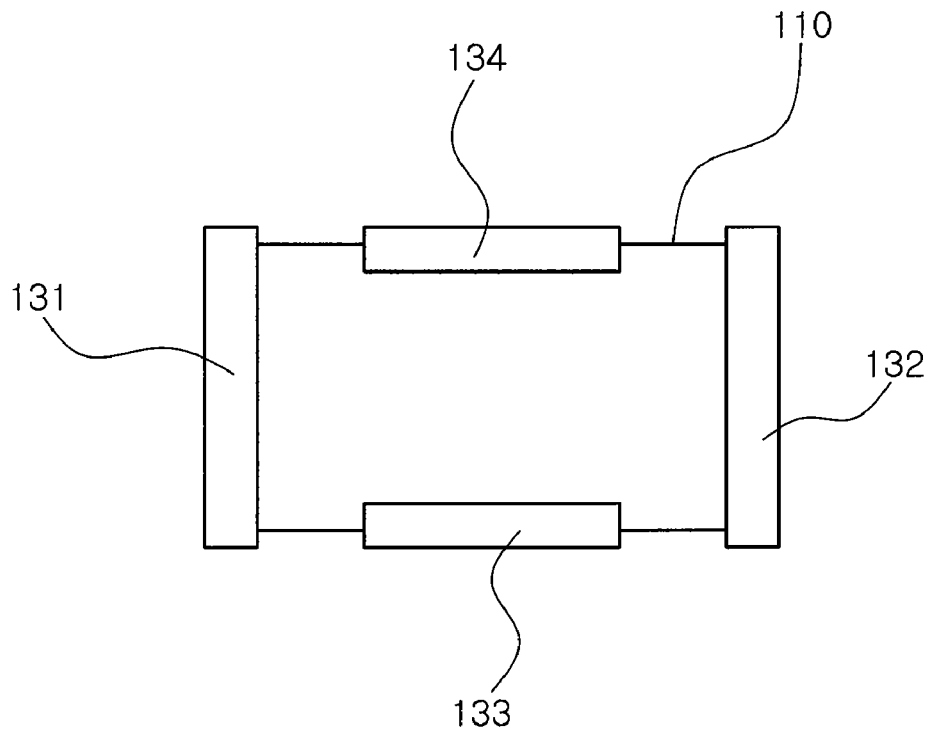
Figure 3:
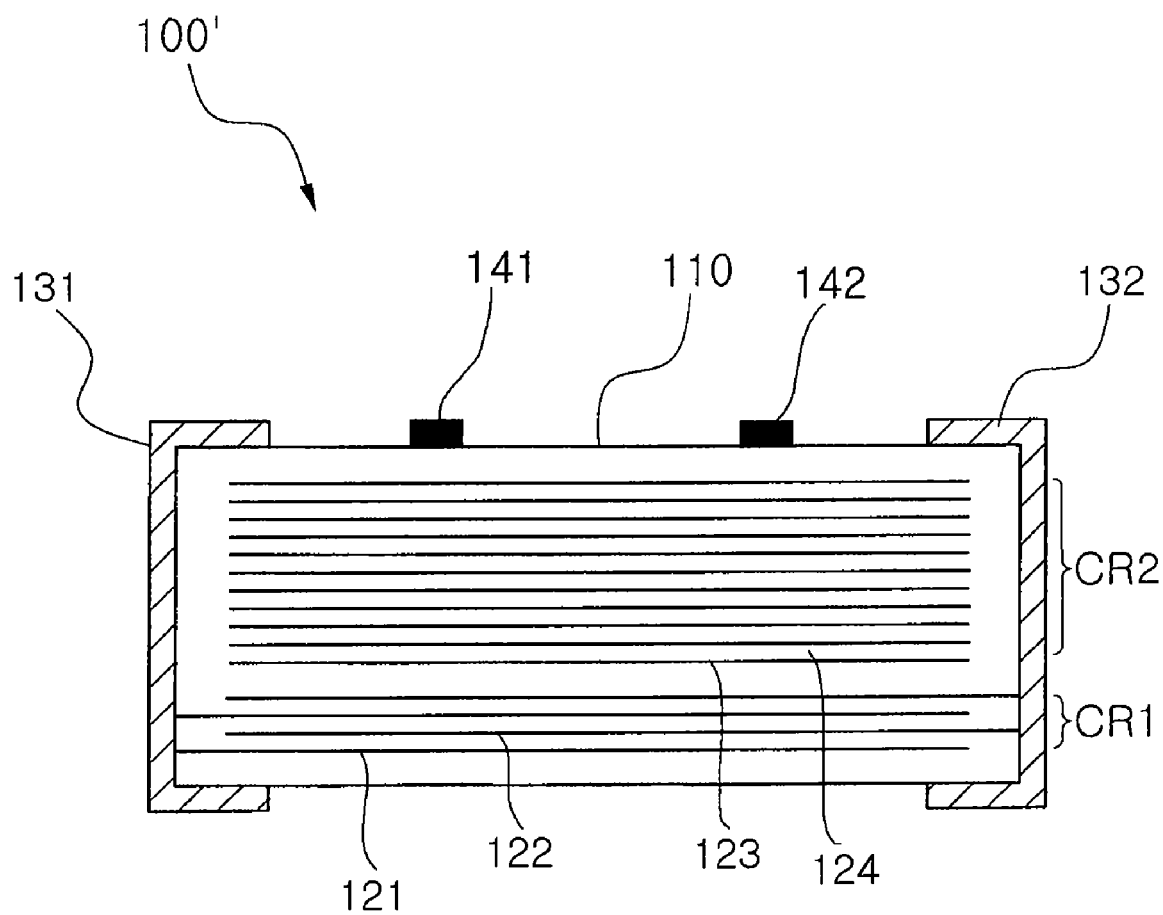
FIG. 3 is a cross-sectional view illustrating the multilayer chip capacitor of FIG. 1, cut along a line SS'.
Figure 4:
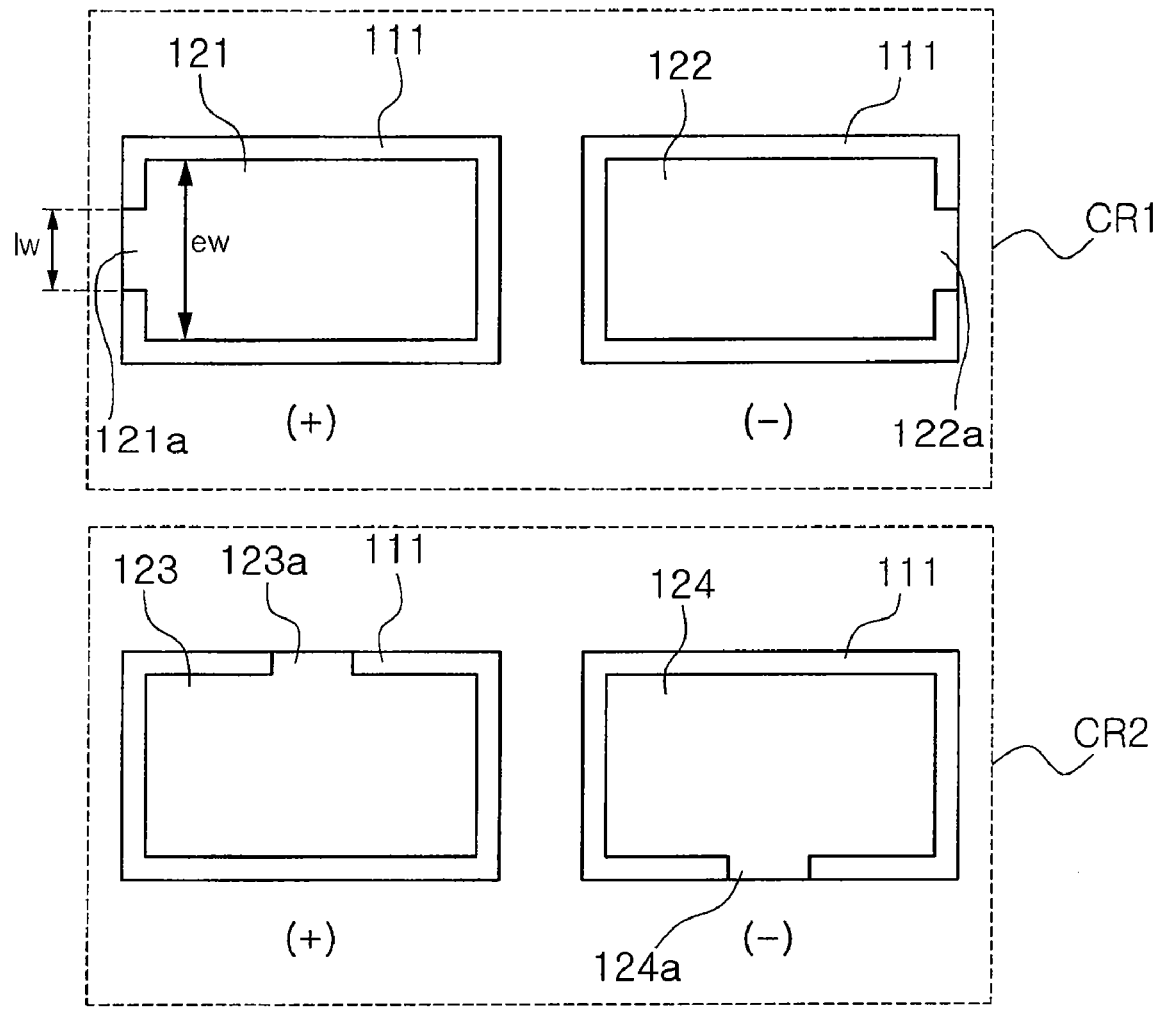
FIG. 4 is a top view illustrating an inner electrode configuration of the multilayer chip capacitor of FIG. 1.

FIG. 1 is a perspective view illustrating an external shape of a multilayer chip capacitor 100 according to an embodiment of the present invention. FIGS. 2A and 2B are a top view and a bottom view illustrating the multilayer chip capacitor 100 of FIG. 1. FIG. 3 is a cross-sectional view illustrating the multilayer chip capacitor 100 of FIG. 1, cut along a line SS'. FIG. 4 is a top view illustrating an inner electrode configuration of the multilayer chip capacitor 100 of FIG. 1.

Referring to FIGS. 1 to 4, the multilayer chip capacitor 100 includes a capacitor body 110 and a plurality of outer electrodes 131, 132, 133, and 134, sequentially, first to fourth outer electrodes, formed on side surfaces of the capacitor body 110. The capacitor body 110 is formed by laminating a plurality of dielectric layers. In the capacitor body 110, a plurality of inner electrodes 121, 122, 123, and 124, sequentially, first to fourth inner electrodes, are disposed, separated from each other interposing a dielectric layer therebetween. The first inner electrode 121 has a different polarity from that of the second inner electrode 122. The third inner electrode 123 has a different polarity from that of the fourth inner electrode 124. The first and second outer electrodes 131 and 132 are disposed on two side surfaces, particularly, shorter side surfaces of the capacitor body 110, opposite to each other. The third and fourth outer electrodes 133 and 134 are disposed at two opposite side surfaces, particularly, longer side surfaces. The multilayer chip capacitor 100 may be, but not limited to, a four-terminal capacitor totally having four outer electrodes.

As shown in FIGS. 3 and 4, the capacitor body 110 includes a first capacitor part CR1 and a second capacitor part CR2 disposed along a lamination direction that is a z-axis direction. The first capacitor part CR1 includes the first and second inner electrodes 121 and 122 alternately disposed to be opposite to each other interposing the dielectric layer therebetween. As illustrated, the first and second inner electrodes 121 and 122 are alternately disposed. The second capacitor part CR2 includes the third and fourth inner electrodes 123 and 124 alternately disposed to be opposite to each other, interposing the dielectric layer therebetween.

In the first capacitor part CR1, the first and second inner electrodes 121 and 122 are connected to the first and second outer electrodes 131 and 132 via leads 121a and 122a, respectively. In the second capacitor part CR2, the third and fourth inner electrodes 123 and 124 are connected to the third and fourth outer electrodes 133 and 134 via leads 123a and 124a, respectively. The first and second inner electrodes 121 and 122 are directly connected to the first and second outer electrodes 131 and 132 and are indirectly connected to the third and fourth outer electrodes 133 and 134. Similarly, the third and fourth inner electrodes 123 and 124 are directly connected to the third and fourth outer electrodes 133 and 134 and are indirectly connected to the first and second outer electrodes 131 and 132.

An equivalent series resistance (ESR) of the first capacitor part CR1 may be adjusted by changing a width lw of the leads 121a and 122a of the first and second inner electrodes 121 and 122. The greater a width of a lead, the greater a width of a path of a current flowing through the lead. Accordingly, a resistance R is reduced. When necessary, the lead width lw of the first and second inner electrodes 121 and 122 may be extended to a width ew of a shorter side edge of an overall main part of inner electrodes. In this case, the first and second inner electrodes 121 and 122 have the shape of a rectangle whose overall shorter edge length is connected to the first and second outer electrodes 131 and 132 while in contact therewith.

Similarly, an ESR of the second capacitor part CR2 may be adjusted by changing a width of the leads 123a and 124a of the third and fourth inner electrodes 123 and 124. Also, the leads 123a and 134a of the third and fourth inner electrodes 123 and 124 may be extended to a width of a longer side edge of the overall main part of the inner electrodes when necessary. A change of the lead width has an effect on not only an ESR but also ESL.

As shown in FIGS. 1 to 3, the first and second outer electrodes 131 and 132 of the first capacitor part CR1 are connected to the third and fourth outer electrodes of the second capacitor part CR2 via connection conductor lines 141 and 142. The connection conductor lines 141 and 142 act as a kind of conductive resistors, which connect the first capacitor part CR1 to the second capacitor part CR2 in parallel and connect the second capacitor part CR2 to an additional resistor in series.

In the present embodiment, the connection conductor lines 141 and 142 may, but not limited to, be disposed on a top surface. For example, the connection conductor lines 141 and 142 may be disposed at only a bottom surface or at top and bottom surfaces. In addition, the connection conductor lines 141 and 142 may be disposed at side surfaces or at side, top, and bottom surfaces and may be appropriately disposed on an outer surface of the capacitor body 110 to connect outer electrodes having the same polarity to one another. Only, when having an internal structure whose top and bottom are asymmetrical to each other, as in the present embodiment (refer to FIGS. 2A and 2B), the connection conductor lines 141 and 142 may be formed on the top surface to easily distinguish the top surface and bottom surface from each other.

As shown in FIG. 3, the first capacitor part CR1 is located at one or more ends, that is, one of top and/or bottom in the multilayer chip capacitor 100 in a lamination direction that is a z-axis direction. As described as follows, the multilayer chip capacitor 100 is mounted on a circuit board in such a way that the first capacitor part CR1 is more adjacent to a mounting surface of the circuit board than the second capacitor part CR2. Particularly, in the present embodiment, the first capacitor part CR1 is located at one end, that is, a bottom, in the lamination direction and the second capacitor part CR2 is located thereon. In this case, the bottom or a bottom surface of the multilayer chip capacitor 100 indicates a portion or a surface adjacent to the mounting surface while the multilayer chip capacitor 100 is mounted on the circuit board. The first capacitor part CR1 is connected to the second capacitor part CR2 in parallel via the outer electrodes 131 to 134 and the connection conductor lines 141 and 142.

The first capacitor part CR1 includes a smaller number of laminated inner electrodes than that of the second capacitor part CR2 to have an appropriate ESR. Accordingly, to embody a desired or determined capacitance, the second capacitor part CR2 connected to the first capacitor part CR1 in parallel is generally used. To embody the capacitance, a total number of laminated third and fourth inner electrodes 123 and 124 in the second capacitor part CR2 is to be greater than a total number of laminated first and second inner electrodes 121 and 122 in the first capacitor part CR1. Accordingly, a capacitance of the second capacitor part CR2 is higher than that of the first capacitor part CR1 and the ESR of the second capacitor part CR2 is smaller than an ESR of the first capacitor part CR1 whose total number of laminated inner electrodes is relatively smaller.

Figure 5:
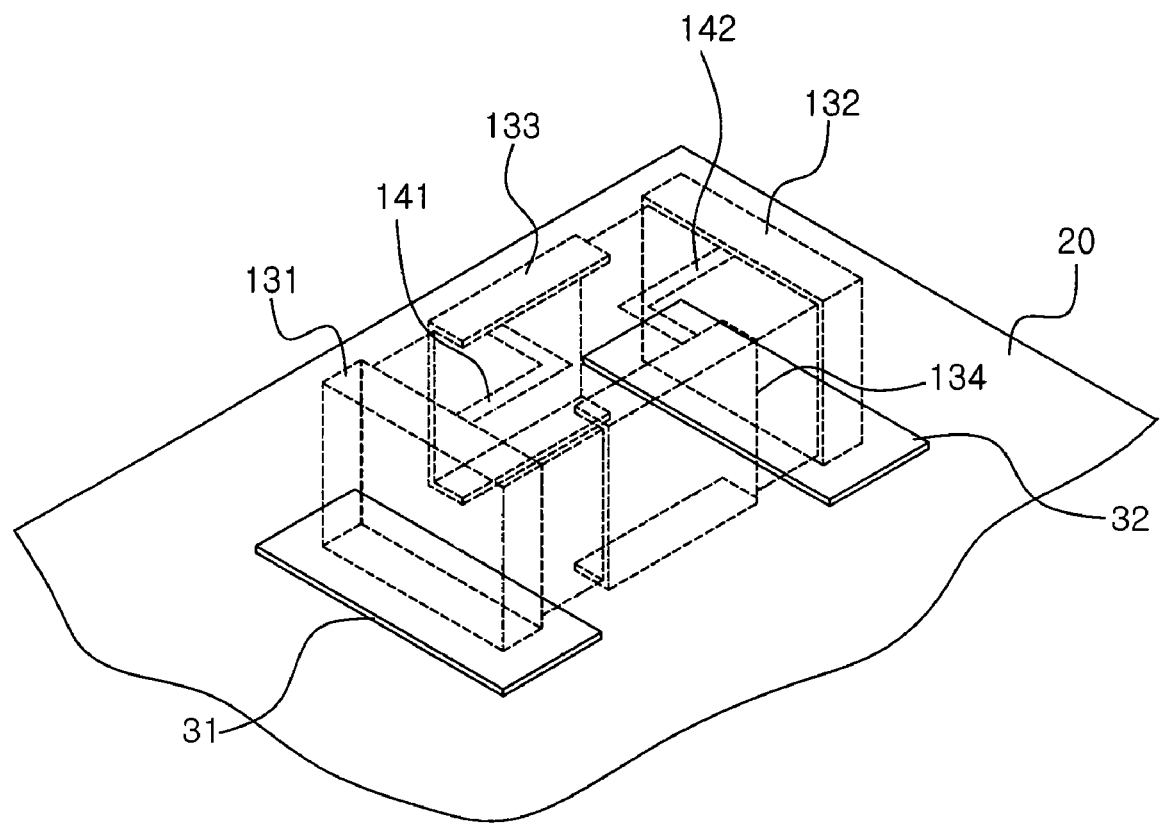
FIG. 5 is a perspective view illustrating a circuit board device where the multilayer chip capacitor of FIG. 1 is mounted on a circuit board.

FIG. 5 is a circuit board device according to an exemplary embodiment of the present invention, in which the multilayer chip capacitor 100 is mounted on a circuit board 20. Referring to FIG. 5, a first pad 31 and a second pad 32 are formed on a mounting surface of the circuit board. The first and second pads 31 and 32 are electrically connected to an external circuit (not shown) provided on the circuit board 20. The multilayer chip capacitor 100 is mounted on the mounting surface in such a way that the first capacitor part CR1 having a higher ESR than that of the second capacitor part CR2 is more adjacent to the mounting surface.

The first pad 31 of the circuit board 20 is connected to the first outer electrode 131 of the multilayer chip capacitor 100, and the second pad 32 is connected to the second outer electrode 132. Accordingly, the first pad 32 has one polarity, for example, a positive polarity, identical to that of the first and third outer electrodes 131 and 133. Also, the second pad 32 has another polarity, for example, a negative polarity, identical to that of the second and fourth outer electrodes 132 and 134. The first capacitor part CR1 and the second capacitor part CR2 are connected in parallel via the connection conductor lines 141 and 142. In this case, the first and second pads 31 and 32 connected to the first and second outer electrodes 131 and 132 are directly connected to the external circuit of the circuit board 20, such as vias (refer to FIGS. 5 and 8).

The connection conductor lines 141 and 142 not only connect the first and second capacitor parts CR1 and CR2 via connection between outer electrodes having the same polarity but also directly add the resistance to the second capacitor part CR2, thereby actually controlling the ESR of the second capacitor part CR2. Accordingly, when the multilayer chip capacitor 100 is mounted on a pad structure of the circuit board 20, the ESR of the second capacitor part CR2 becomes similar to that of the first capacitor part CR1, thereby controlling the ESR of the multilayer chip capacitor 100 (refer to FIG. 32).

Figure 6A:
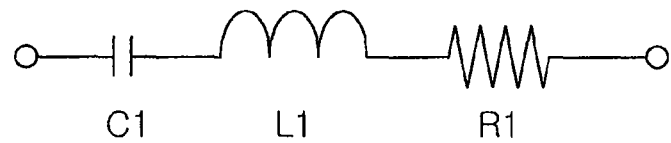
FIGS. 6A to 6C are equivalent circuit diagrams illustrating a first capacitor part, a second capacitor part, and the multilayer chip capacitor mounted on the circuit board in the circuit board device of FIG. 5.
Figure 6B:
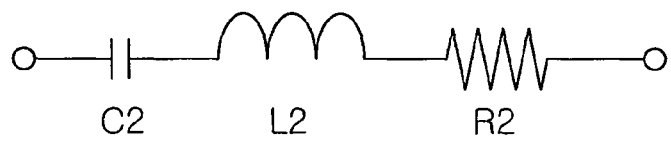
Figure 6C:
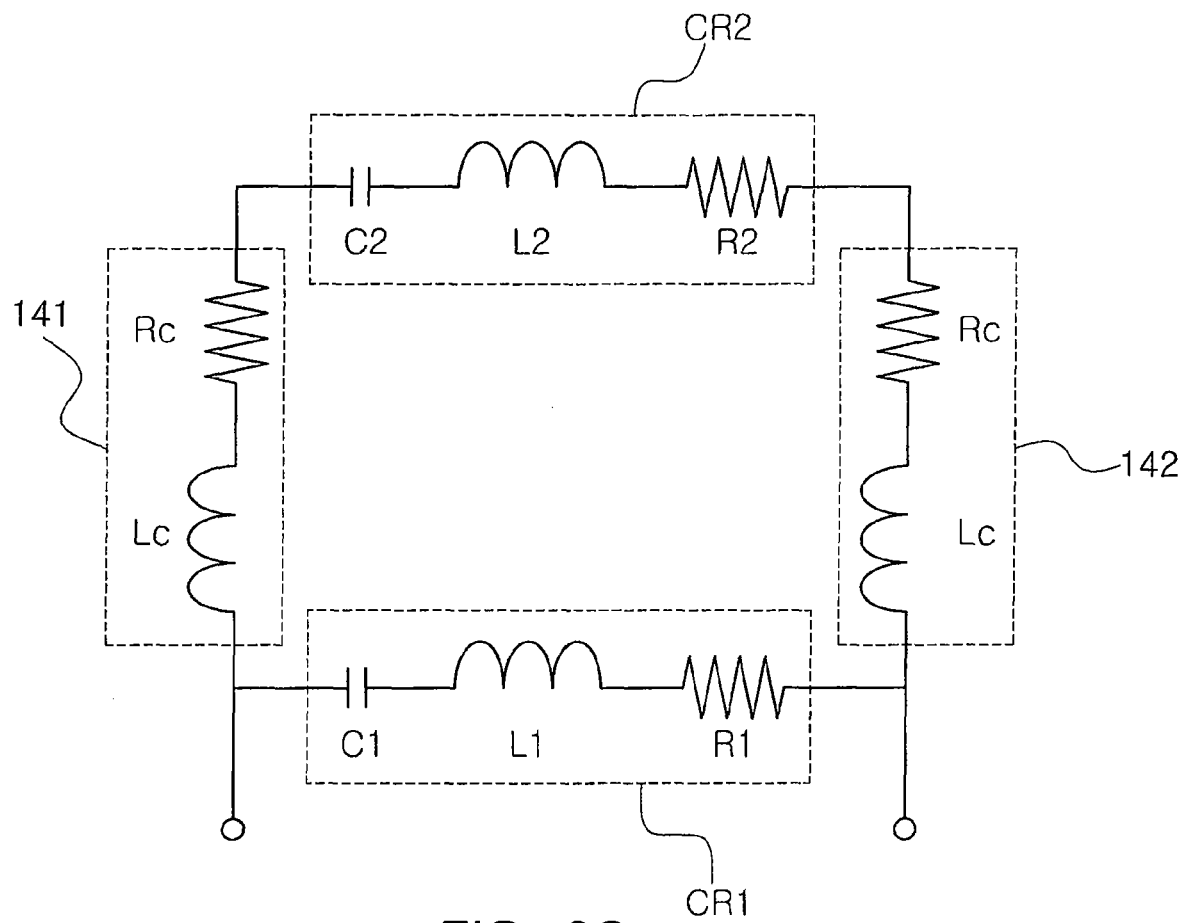

FIGS. 6A to 6C are equivalent circuit diagrams illustrating the first capacitor part CR1, the second capacitor part CR2, and the multilayer chip capacitor 100 mounted on the mounting surface of the circuit board 20. As shown in FIGS. 6A and 6B, an equivalent circuit of the first capacitor part CR1 in the multilayer chip capacitor 100 may be shown as a series circuit including a capacitance C1, an inductance L1, and a resistance R1. An equivalent circuit of the second capacitor part CR2 may be shown as a series circuit including a capacitance C2, an inductance L2, and a resistance R2. As described above, $C1 < C2$ and $R1 > R2$.

The first and second capacitor parts CR1 and CR2 are connected to each other in parallel via the connection conductor lines 141 and 142, and an external circuit terminal is connected to the first capacitor part CR1. Accordingly, as shown in FIG. 6C, resistances Rc and inductances Lc of the first and second conductor lines 141 and 142 are directly added to the resistance R2 and the inductance L2 of the second capacitor CR2, and a series circuit part 141, CR2, and 142 is connected to an equivalent circuit part C1-L1-R1 of the first capacitor part CR1 in parallel. In FIG. 6C, the first and second connection conductor lines 141 and 142 have the same resistance Rc and inductance Lc. However, the present invention will not be limited thereto. A resistance or inductance of each of the connection conductor lines 141 and 142 may be different from each other.

Figure 7:
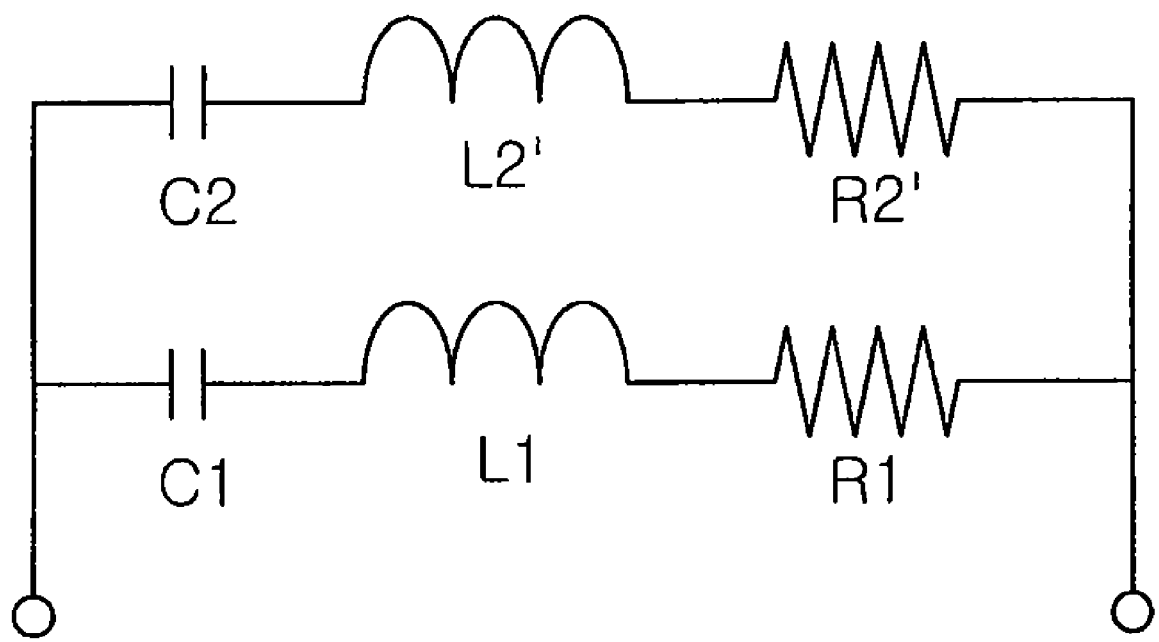
FIG. 7 is an equivalent circuit diagram more simply illustrating the multilayer chip capacitor of FIG. 6C.

The equivalent circuit of FIG. 6C may be more simply shown as in FIG. 7. In FIG. 7, L2' and R2' may be as shown in following Equation 1.

$$L2'=L2+2Lc, R2'=R2+2Rc \quad \text{Equation (1)}$$

Accordingly, an addition of the resistances 2Rc of the connection conductor lines 141 and 142, the ESR of the second capacitor part CR2 is capable of actually being increased. As described above, to provide a capacitance, since the second capacitor CR2 has a number of laminated inner electrodes, greater than that of the first capacitor CR1, the ESR of the second capacitor CR2 is smaller than the ESR of the first capacitor CR1. This ESR Gap prevents power network impedance from being uniform. However, the ESR of the second capacitor part CR2 is actually increased due to a series addition of the resistances 2Rc of the connection conductor lines 141 and 142. Accordingly, the difference between the ESRs of the first and second capacitor parts CR1 and CR2 is actually decreased, thereby embodying uniform impedance characteristics in a wide frequency band.

Due to the connection conductor lines 141 and 142, as shown in Equation 1, an equivalent series inductance (ESL) of the second capacitor CR2 is actually increased. However, regardless of the actual increase of the ESL of the second capacitor part CR2, an impedance of the multilayer chip capacitor 100 in a high frequency band is influenced by an ESL of the first capacitor CR1. The capacitor impedance is mainly affected by an inductance in a high frequency band, and the first capacitor part CR1 is disposed adjacent to the mounting surface in such a way that a current forms a current loop in a short path via the first capacitor CR1 in the high frequency band. Not only it is possible to embody uniform impedance characteristics in a wide frequency band, but also an ESL of the multilayer chip capacitor 100 is maintained to be relatively lower in a high frequency band (refer to FIG. 32). The multilayer chip capacitor 100 may be useful as a decoupling capacitor mounted on a micro processing unit (MPU) package or a main board.

The resistance Rc added to the second capacitor part CR2 by the connection conductor lines 141 and 142 may be controlled by changing conductivity of the connection conductor lines 141 and 142 or by changing a length, a width, and a thickness of the connection conductor lines 141 and 142. As a material for the connection conductor lines 141 and 142, there are ruthenium oxides or tungsten.

The connection conductor lines 141 and 142 may be formed of a thin film by sputtering. The connection conductor lines 141 and 142 may be formed of a thick layer such as a heat or ultraviolet (UV) hardened resistor by screen-printing. When using a thin film process to form the connection conductor lines 141 and 142, it is possible to accurately adjust a width and a thickness of a line and control the ESR in a relatively wide range in an area in the same area. On the other hand, when using a thick layer printing process, in comparison with the thin film process, the width and the thickness of the line can be hardly adjusted with accuracy but manufacturing costs for the connection conductor lines 141 and 142 may be lowered.

Forming the connection conductor lines 141 and 142 is possible before or after firing of the multilayer chip capacitor 100 according to a firing temperature of a used material. When the firing temperature of the connection conductor lines 141 and 142 is similar to that of the multilayer chip capacitor 100, it is possible to fire the connection conductor lines 141 and 142 together with the multilayer chip capacitor 100 after forming the line. When the firing temperature of the connection conductor lines 141 and 142 is lower than that of the multilayer chip capacitor 100, the connection conductor lines 141 and 142 are fired after forming the line after the multilayer chip capacitor 100 are fired.

Figure 8:
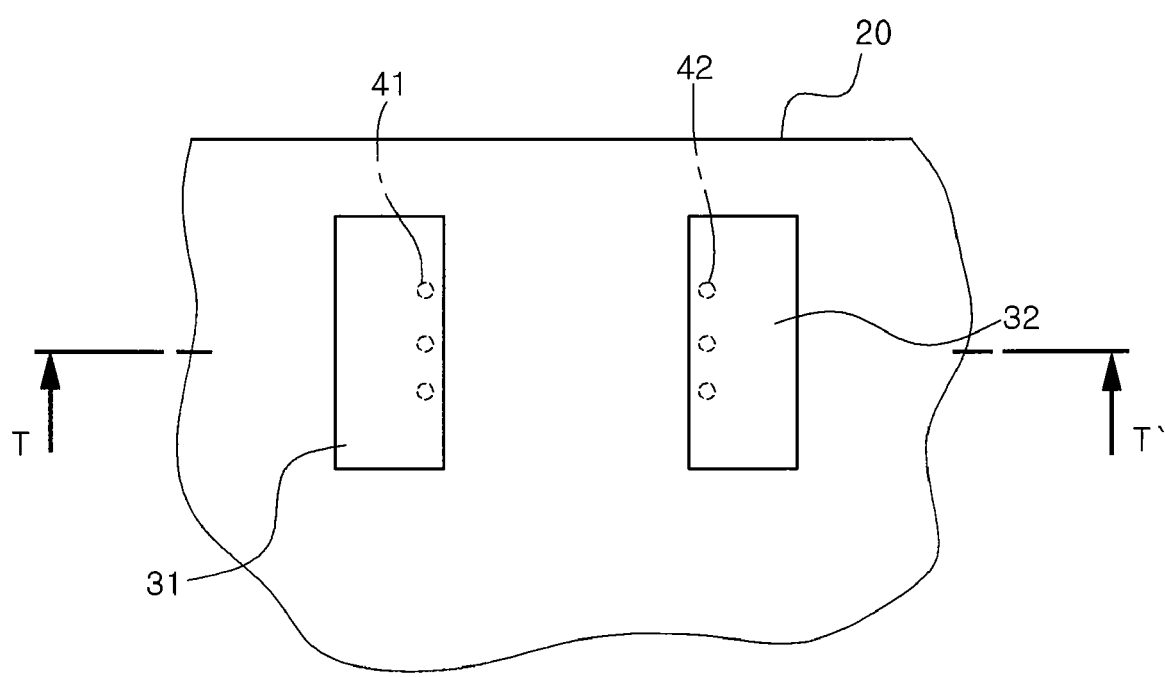
FIG. 8 is a schematic top view illustrating the circuit board of FIG. 5.
Figure 9:
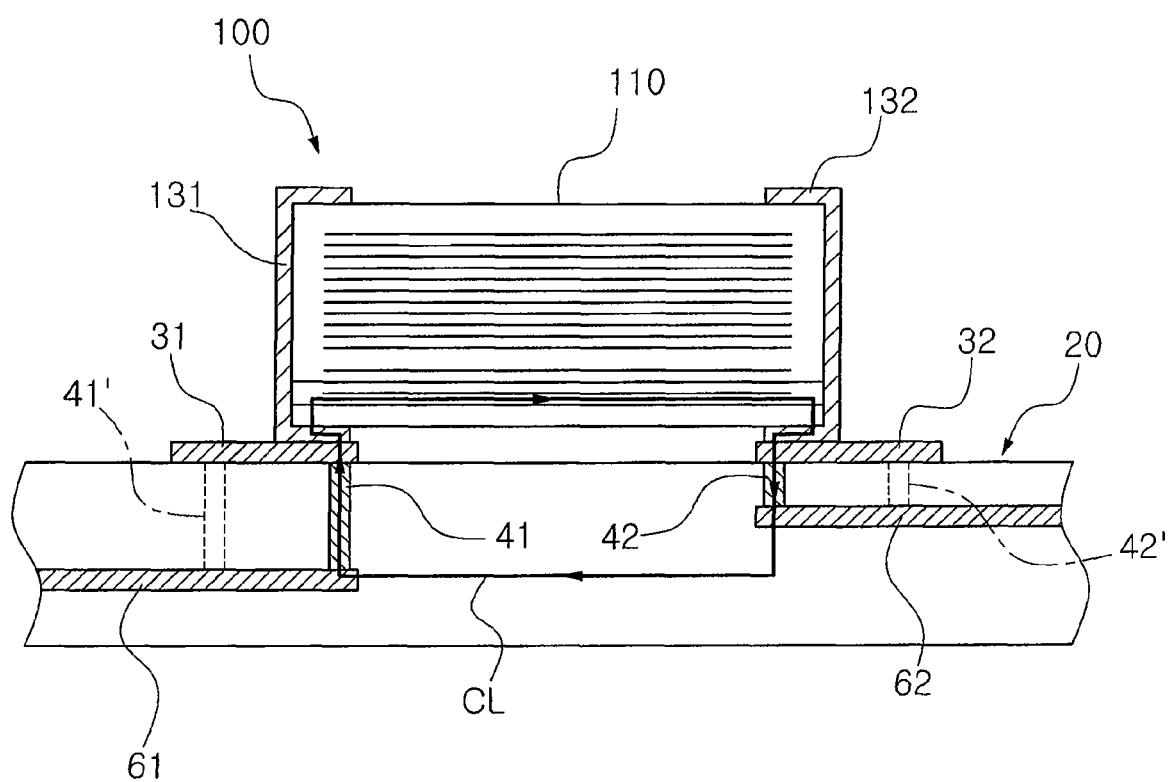
FIG. 9 is a cross-sectional view illustrating the circuit board device of FIG. 5.

FIG. 8 is a schematic top view illustrating the circuit board 20, and FIG. 9 is a cross-sectional view illustrating the circuit board device of FIG. 5, cut along a line TT'. Referring to FIGS. 8 and 9, the first and second pads 31 and 32 are disposed on the circuit board 20. As a part of an external circuit such as a circuit for applying a supply voltage to a decoupling capacitor, vias 41 and 42 are formed in the circuit board 20. The vias 41 and 42 are directly connected to the first and second pads 31 and 32 connected to the first capacitor part CR1. The first pad 31 may be connected to a first electrode pattern 61, for example, a power electrode pattern, via the via 41. The second pad 32 may be connected to a second electrode pattern 62, for example, a ground electrode pattern, via the via 42.

As described above, the first and second outer electrodes 131 and 132 disposed on both shorter side surfaces of the capacitor body 110 are connected to the first and second pads 31 and 32 of the circuit board 20. Accordingly, according to the present embodiment, a conventional two-terminal capacitor circuit board including two pads for mounting a capacitor may be used as it is. Such compatibility of a circuit board provides an advantage of reducing total manufacturing costs of the circuit board device.

As shown in FIG. 9, the via 41 connected to the first pad 31 is disposed adjacent to the second pad 32 and the via 42 connected to the second pad 32 is disposed adjacent to the first pad 31. As the vias 41 and 42 having a different polarity are disposed more adjacent to each other, size of a current loop CL flowing through the first capacitor part CR1 via the first and second pads 31 and 32 is reduced, thereby reducing an inductance caused by the current loop. As indicated with a dotted line of FIG. 9, when vias 41' and 42' having a different polarity are disposed far from each other, the current loop size becomes greater and an inductance caused by the current loop becomes increased.

Also, two or more vias may be connected to the first and second pads 31 and 32. For example, there are three vias connected to the first and second pads 31 and 32, respectively, in FIG. 8. The inductance caused by the current loop may be connected in parallel by forming the two or more vias, thereby more reducing an overall inductance.

Figure 10:
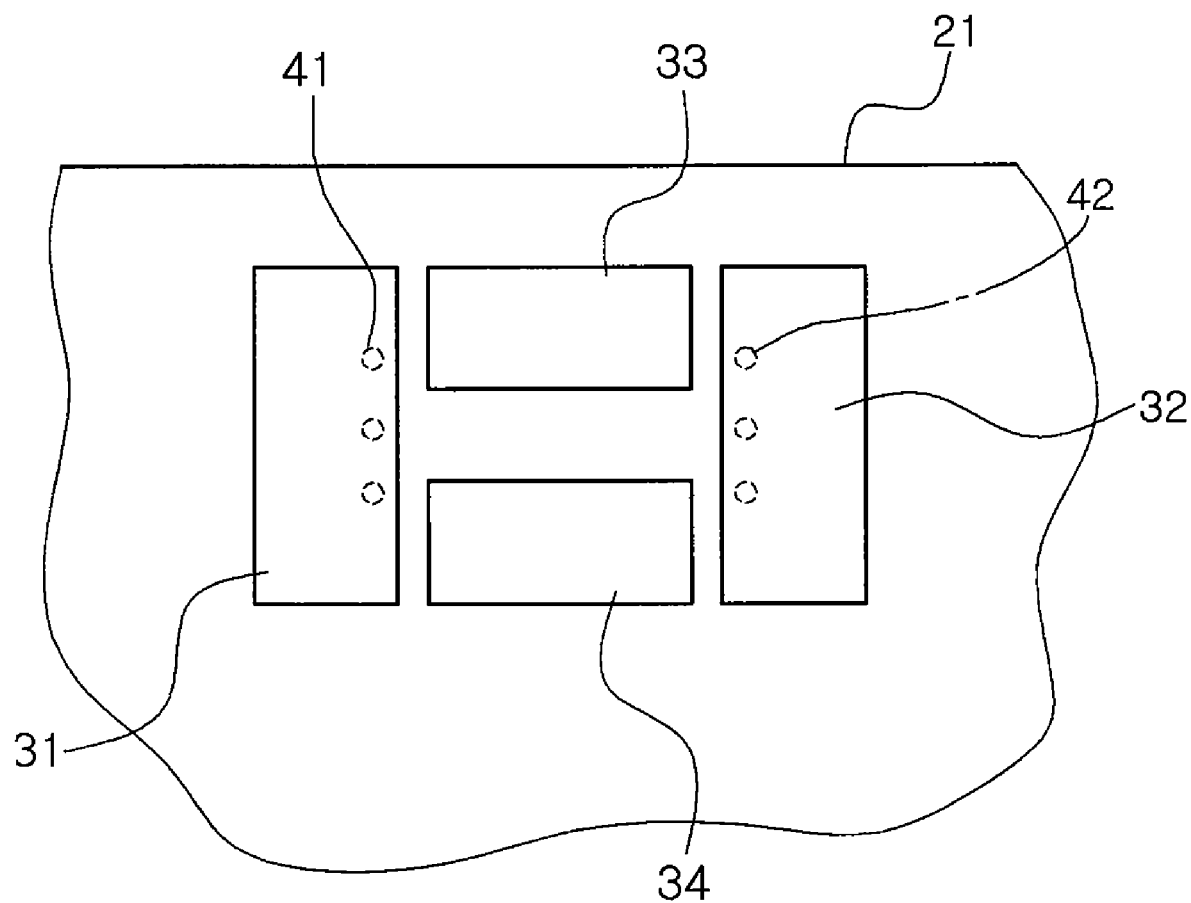
FIG. 10 is a top view illustrating a modified example of the circuit board of FIG. 8.

FIG. 10 is a top view illustrating a modified example of the circuit board 20 of FIG. 8. To mount the multilayer chip capacitor 100, instead of the circuit board 20, a circuit board 21 may be used. Referring to FIG. 10, the circuit board 21 further includes a third pad 33 and a fourth pad 34, in addition to the first and second pads 31 and 32. The third and fourth pads 33 and 34 may be connected to the third and fourth outer electrodes 133 and 134 of the multilayer chip capacitor 100.

However, different from the first and second pads 31 and 32, the third and fourth pads 33 and 34 are not directly connected to the external circuit such as vias and are electrically floated. Accordingly, the first and second outer electrodes 131 and 132 of the multilayer chip capacitor 100 are directly connected to the external circuit via the first and second pads 31 and 32, but the third and fourth outer electrodes 133 and 134 are a kind of floated electrodes and connected to the external circuit via the first and second connection conductor lines 141 and 142.

On the other hand, to mount the multilayer chip capacitor 100 including the first and second connection conductor lines 141 and 142, a circuit board further including only one of the third pad 33 and the fourth pad 34 in addition to the first and second pads 31 and 32 may be used.

Figure 11:
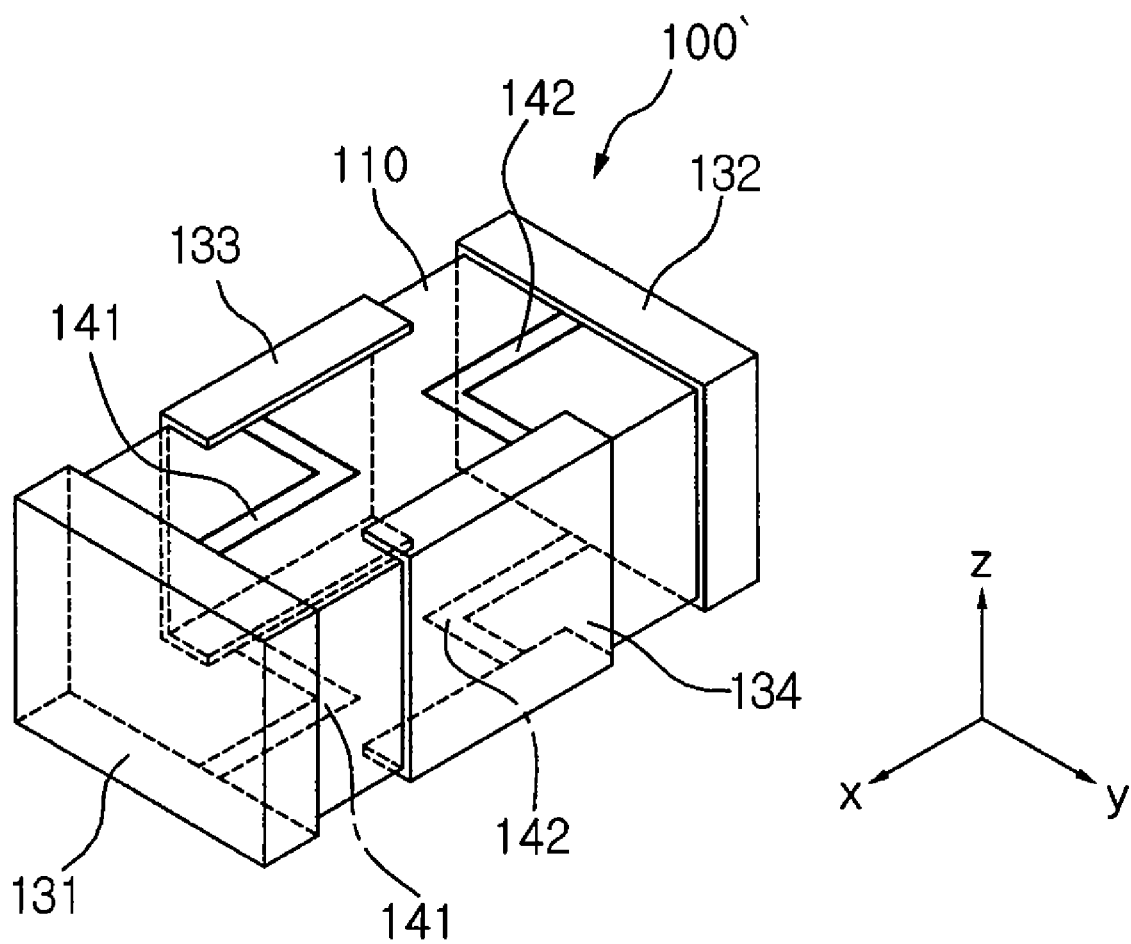
FIG. 11 is a perspective view illustrating a modified example of the multilayer chip capacitor of FIG. 1.
Figure 12:
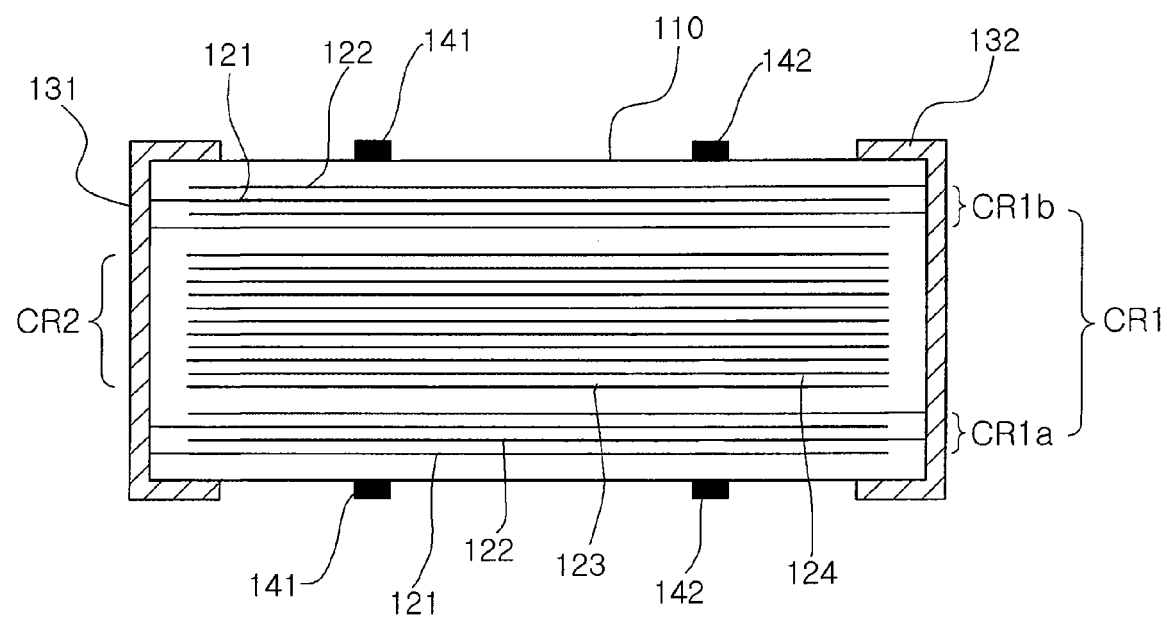
FIG. 12 is a cross-sectional view illustrating the multilayer chip capacitor of FIG. 11.

FIG. 11 is a perspective view illustrating a modified example of the multilayer chip capacitor 100 of FIG. 1, and FIG. 12 is a cross-sectional view illustrating a multilayer chip layer 100' of FIG. 11. The multilayer chip capacitor 100' has inner and outer structures with symmetrical top and bottom.

As shown in FIGS. 11 and 12, the first and second connection conductor lines 141 and 142 are formed on a top surface and a bottom surface of the capacitor body 110 and the top and bottom are symmetrical to each other in the inner and outer structures. As shown in FIG. 12, two first capacitor parts CR1a and CR1 are disposed on both ends such as a top and a bottom of a lamination direction that is a z-axis direction and the second capacitor part CR2 is interposed therebetween. The first capacitor part CR1 and the second capacitor part CR2 are connected to each other in parallel via the outer electrodes 131 to 134 and the connection conductor lines 141 and 142.

Particularly, the overall multilayer chip capacitor 100' may have top and bottom symmetry by disposing the first capacitor part CR1a and CR1b on the both ends to be symmetrical to each other. Due to the top and bottom symmetry, a direction of the top and bottom is disappeared when mounting a capacitor, thereby mounting the capacitor regardless of top and bottom. The embodiment shown in FIGS. 11 and 12, connection relationship between each of the first and second capacitor parts CR1 and CR2 and the connection conductor lines 141 and 142 may be shown as in FIGS. 6A to 6C and the circuit board for mounting is identical to the circuit board 20 of FIGS. 8 and 10. Accordingly, in the present embodiment, an effect of a series resistance addition to the second capacitor part CR2 via the connection conductor lines 141 and 142 may be obtained.

Figure 13:
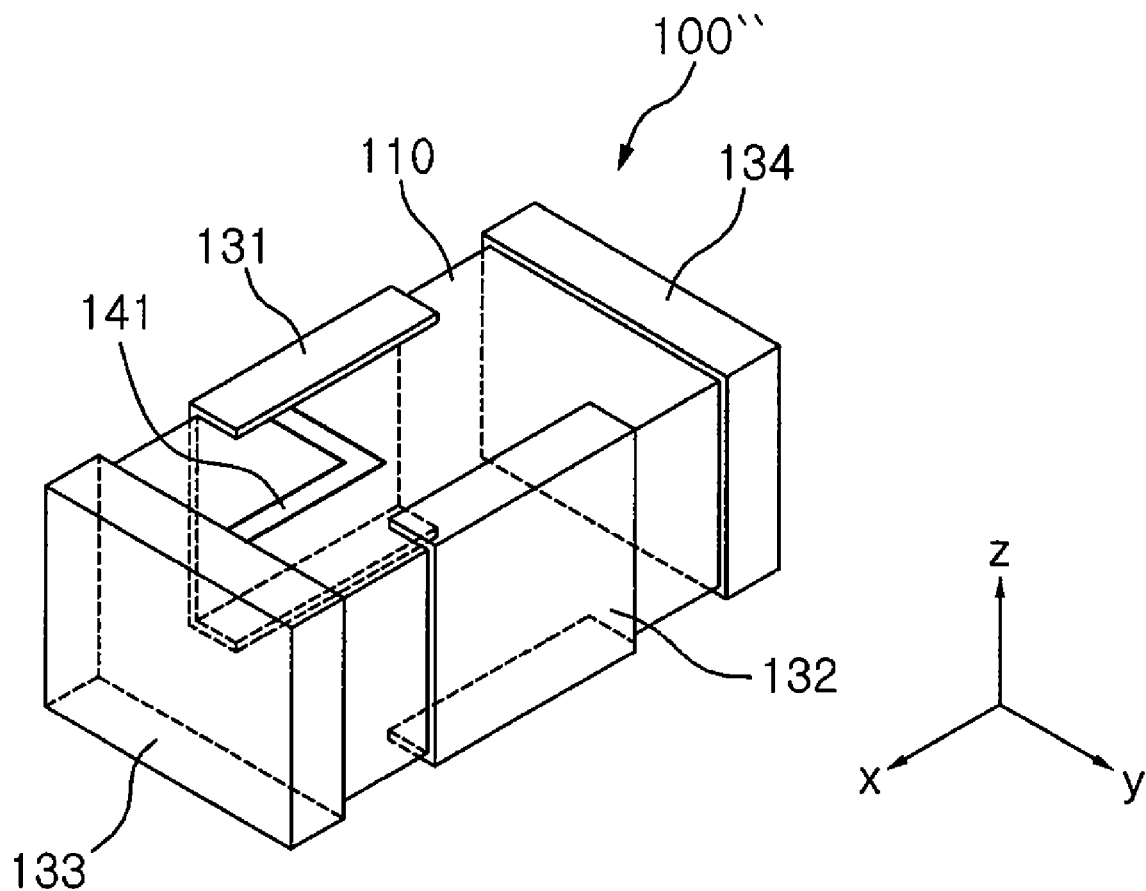
FIG. 13 is a perspective view illustrating another modified example of the multilayer chip capacitor of FIG. 1.
Figure 14:
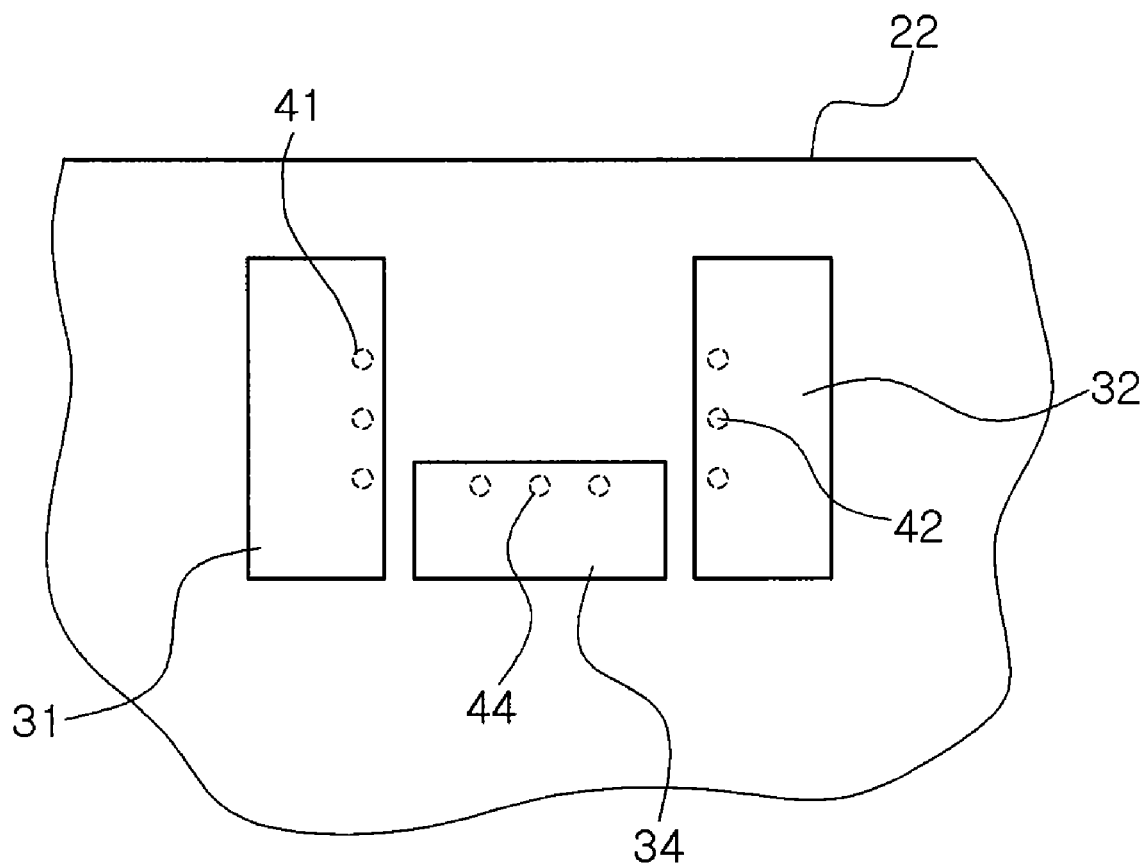
FIG. 14 is a top view illustrating an example of a circuit board where the multilayer chip capacitor of FIG. 13 is mounted.
Figure 15:
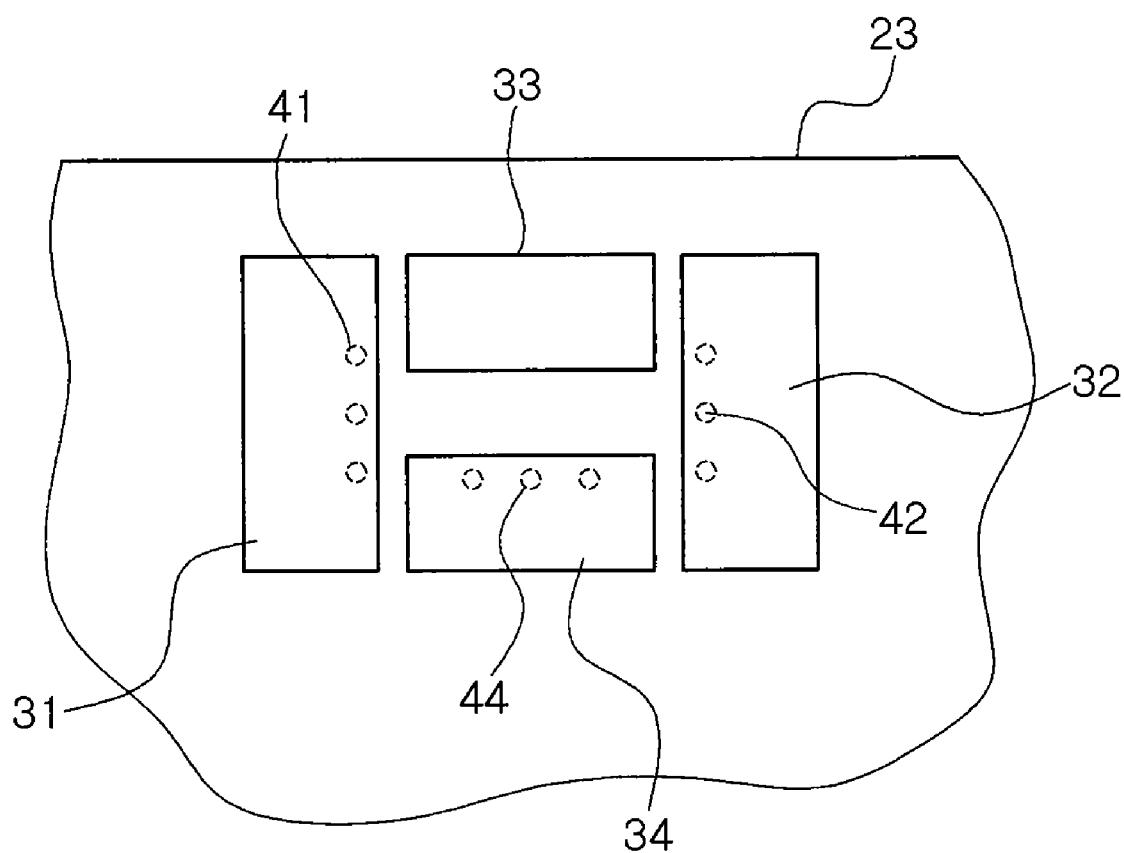
FIG. 15 is a top view illustrating another example of the circuit board where the multilayer chip capacitor of FIG. 13 is mounted.
Figure 16:
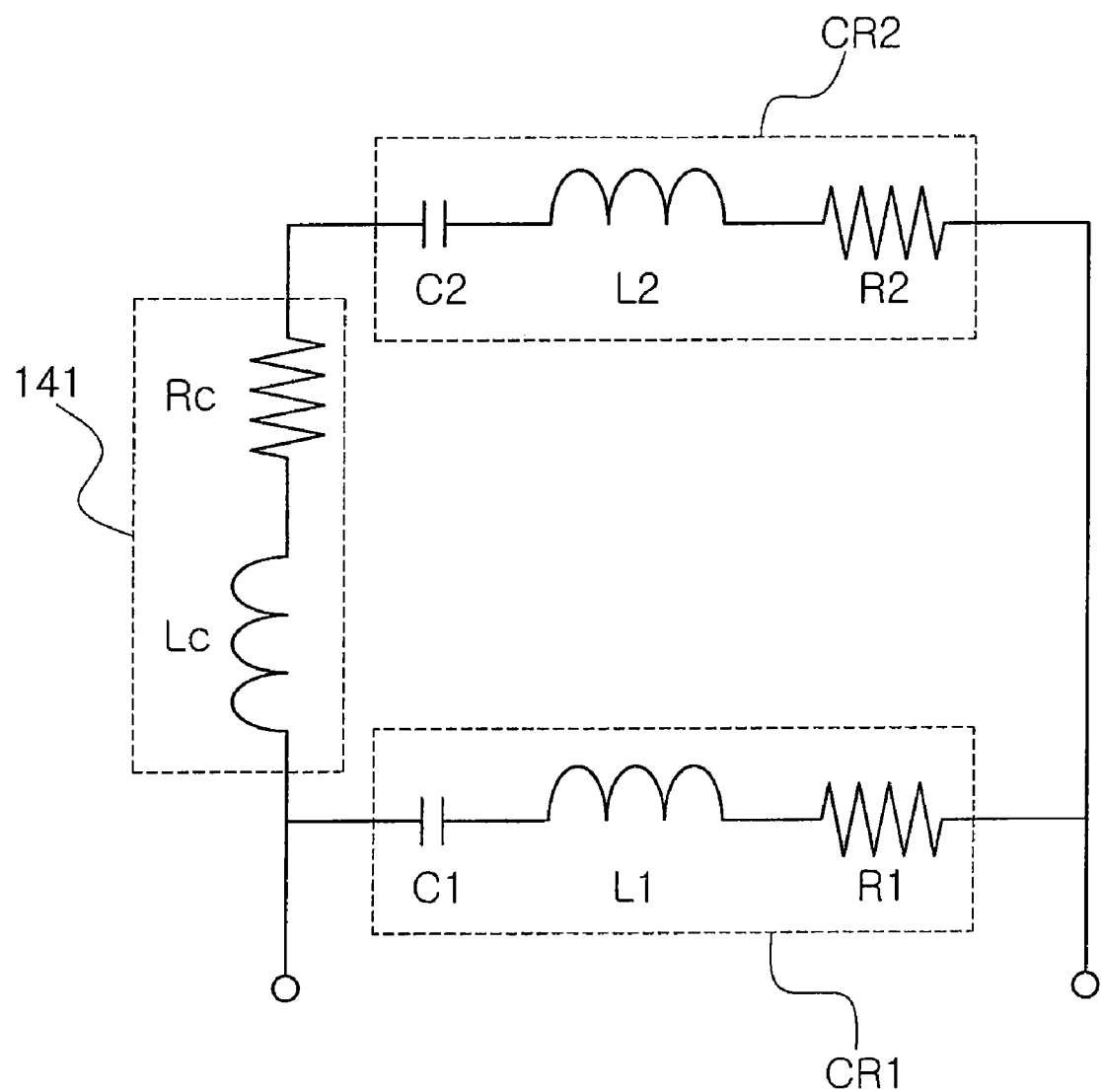
FIG. 16 is an equivalent circuit diagram illustrating the multilayer chip capacitor of FIG. 13, mounted on a circuit board.

FIG. 13 is a perspective view illustrating another modified example of the multilayer chip capacitor 100 of FIG. 1. FIGS. 14 and 15 are top views illustrating examples of a circuit board for mounting a multilayer chip capacitor 100" of FIG. 13, respectively. FIG. 16 is an equivalent circuit diagram illustrating the multilayer chip capacitor 100" of FIG. 13. In the multilayer chip capacitor 100" of FIG. 13, the first and third outer electrodes 131 and 133 are mutually connected via the connection conductor line 141 but the second and fourth outer electrodes 132 and 134 are not connected to each other via a connection conductor line. That is, the second connection conductor line 142 is omitted.

In the multilayer chip capacitor 100" of FIG. 13, an inner structure of the capacitor body 110 may be identical to the asymmetrical top and bottom structure of the capacitor body 110 of FIG. 1 (refer to FIGS. 3 and 4). Differently, the connection conductor line 141 may be additionally formed on the bottom surface of the capacitor body 110 and the inside of the capacitor body 110 may be identical to the asymmetrical top and bottom structure of the capacitor body 110 of FIG. 11 (refer to FIG. 12).

As the circuit board for mounting the multilayer chip capacitor 100", there may be used a circuit board 22 in FIG. 14. As shown in FIG. 14, the circuit board 22 further includes the pad 34 for connected to the fourth outer electrode 133, in addition to the first and second pads 31 and 32 connected to the first and second outer electrodes 131 and 132, respectively. Also, external circuits such as vias 41, 42, and 44 are directly connected to the first, second, and fourth pads 31, 32, and 34.

As described above, the first and second outer electrodes 131 and 132 are directly connected to the external circuits via the first and second pads 31 and 32 by connecting the external circuits to the pads 31, 32, and 34. The fourth outer electrode 134 is directly connected to the external circuit via the pad 34. On the other hand, the third outer electrode 133 is connected to the external circuit via the connection conductor line 141.

As shown in FIG. 15, to mount the multilayer chip capacitor 100" of FIG. 13, a circuit board 23 including an additional floated pad 33 may be used. Referring to FIG. 15, the third pad 33 is further formed in addition to the first, second, and fourth pads 31, 32, and 34 connected to the first, second, and fourth outer electrodes 131, 132, and 134, respectively. The third pad 33 is not directly connected to an external circuit such as via and is connected to the external circuit via the third outer electrode 133 and the connection conductor line 141.

Referring to FIG. 16, in the multilayer chip capacitor 100" mounted on one of the circuit boards 22 and 23, the resistance Rc caused by the connection conductor line 141 is directly added to the second capacitor part CR2, in which Equation 1 is changed into L2'=L2+Lc, R2'=R2+Rc, the connection conductor line 141 and the second capacitor part CR2 connected to each other in series are connected to the first capacitor part CR1 in parallel. Also, not only both ends of the first capacitor part CR1 but also one end of the second capacitor part CR2 is extended to an external circuit, by directly connecting external circuits to the first, second, and fourth pads 31, 32, and 34.

Figure 17:
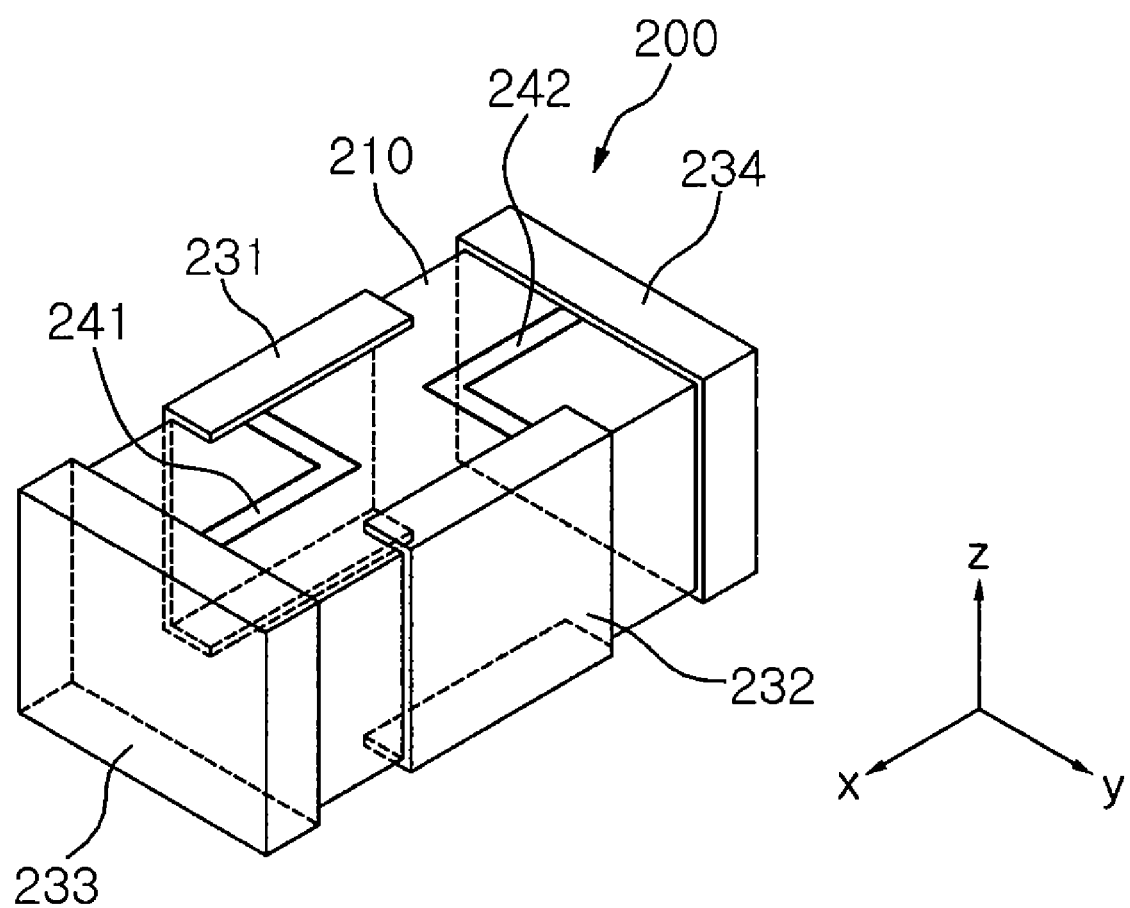
FIG. 17 is a perspective view illustrating a multilayer chip capacitor according to another embodiment of the present invention.
Figure 18A:
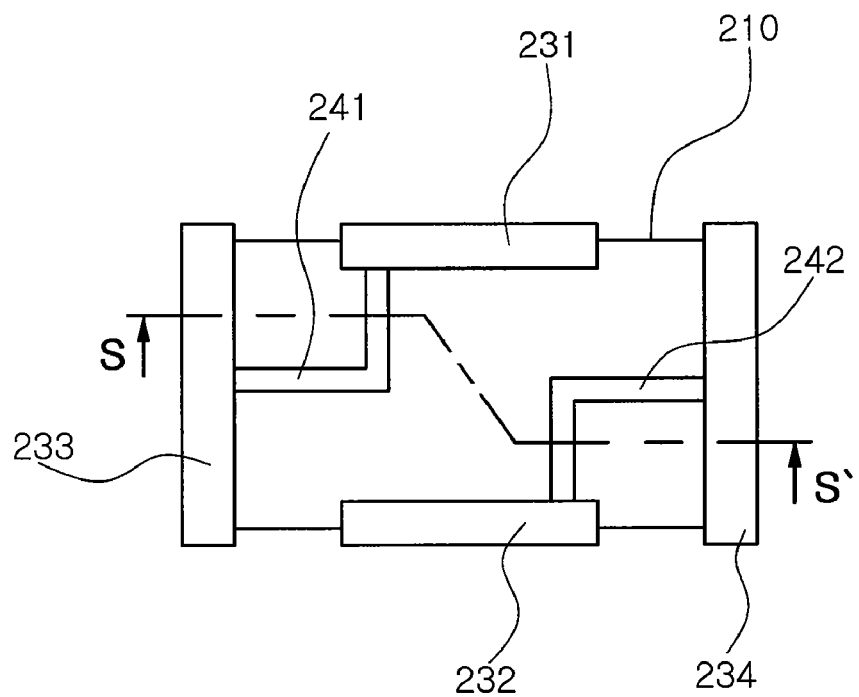
FIGS. 18A and 18B are a top view and a bottom view illustrating the multilayer chip capacitor of FIG. 17.
Figure 18B:
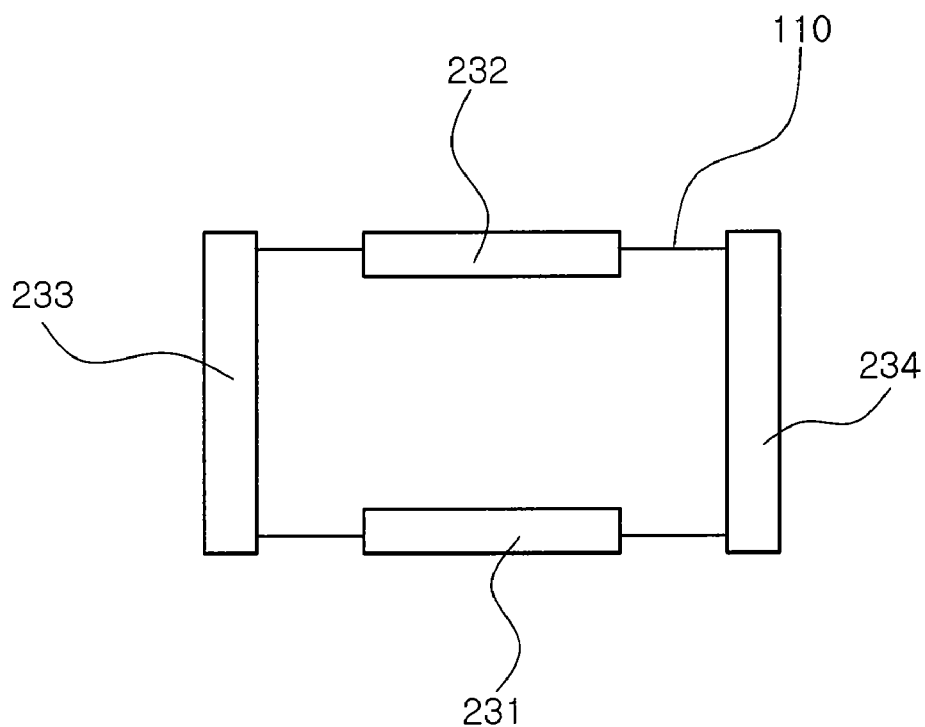
Figure 19:
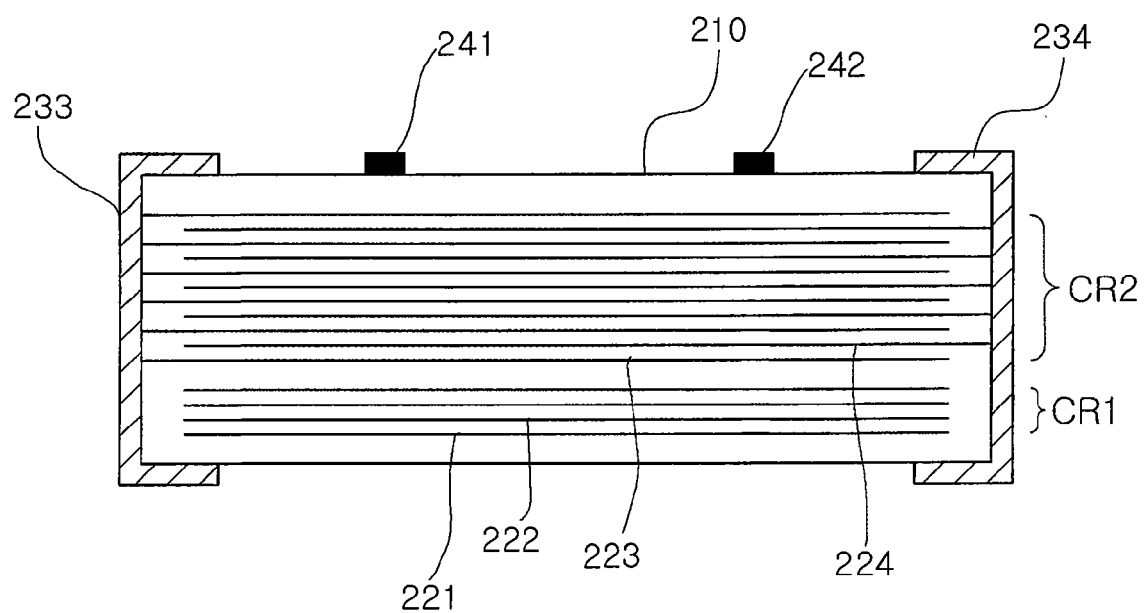
FIG. 19 is a cross-sectional view illustrating the multilayer chip capacitor of FIG. 17, cut along a line SS'.
Figure 20:
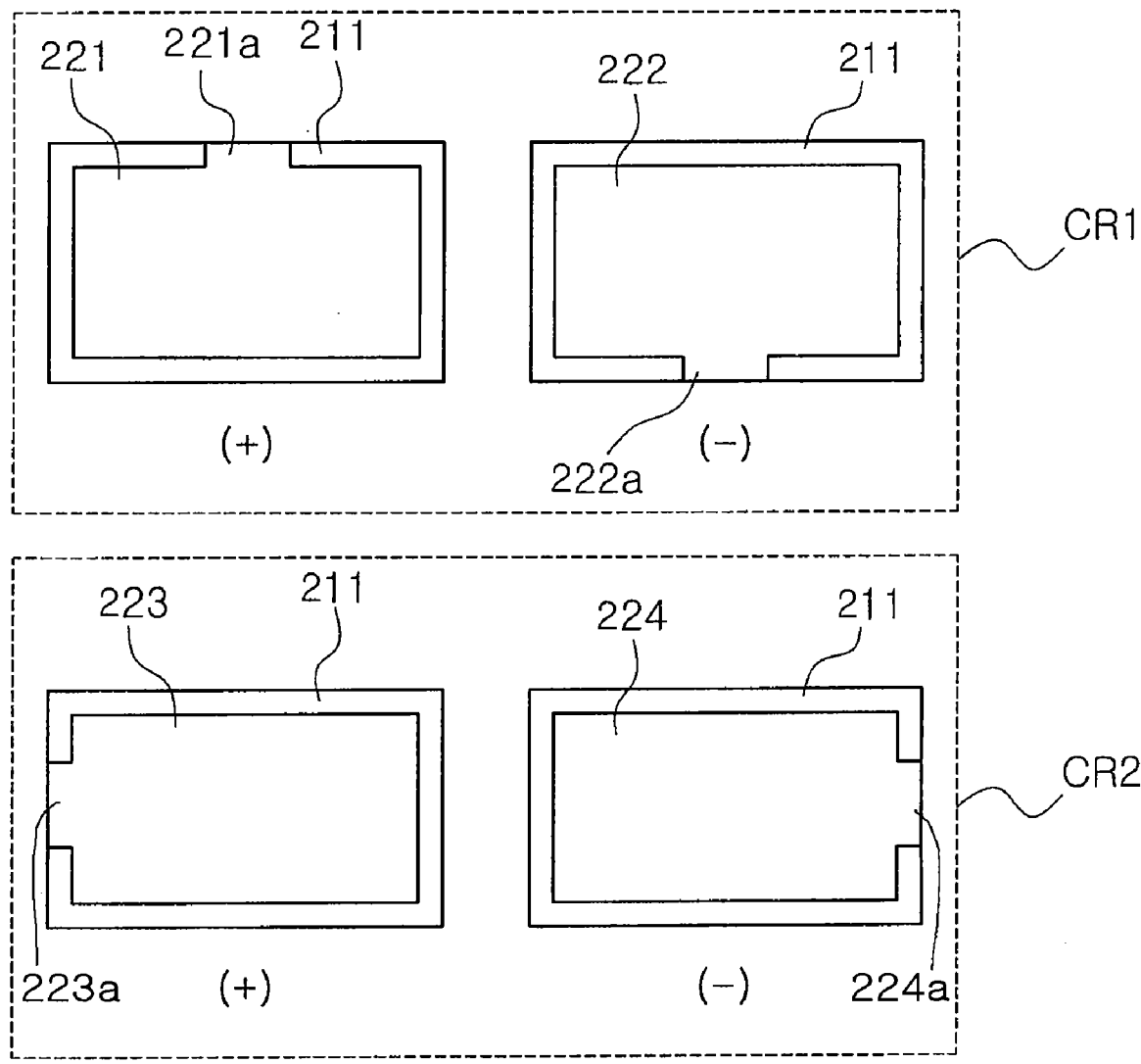
FIG. 20 is a top view illustrating an inner electrode configuration of the multilayer chip capacitor of FIG. 17.

FIG. 17 is a perspective view illustrating a multilayer chip capacitor 200 according to another embodiment of the present invention. FIGS. 18A and 18B are a top view and a bottom view illustrating the multilayer chip capacitor 200. FIG. 19 is a cross-section view illustrating the multilayer chip capacitor 200 cut along a line SS'. FIG. 20 is a top view illustrating an inner electrode structure of the multilayer chip capacitor 200.

Different from the previous embodiment, in the multilayer chip capacitor 200, first and second outer electrodes 231 and 232 of a first capacitor part CR1 disposed at a bottom of a capacitor body 210 are formed on both longer side surfaces of the capacitor body 210 and third and fourth outer electrodes 233 and 234 of a second capacitor part CR2 disposed on a top of the first capacitor part CR1 are formed on both shorter side surfaces of the capacitor body 210. In the present embodiment, the first and second capacitor parts CR1 and CR2 have capacitances C1 and C2 and ESRs R1 and R2 satisfying a relation of C1<C2 and R1>R2.

As shown in FIGS. 17 to 20, first and second inner electrodes 221 and 222 of the first capacitor part CR1 are connected to first and second outer electrodes 231 and 232 via leads 221a and 222a and third and fourth inner electrodes 223 and 224 are connected to third and fourth outer electrodes 233 and 234 via leads 223a and 224a. In the present embodiment, an ESR of a capacitor part may be controlled by changing a width of the leads 221a to 224a. When necessary, a lead width may be extended to an overall length of a longer side or a shorter side of a main inner electrode part.

As shown in FIGS. 17 to 20, since a distance between the first and second outer electrodes 231 and 232 is smaller than a distance between the third and fourth outer electrodes 233 and 234, a length of a current path of the first and second inner electrodes 221 and 222 is shorter than that of the third and fourth inner electrodes 223 and 224. Accordingly, the first capacitor part CR1 may be have a lower ESL than that of the second capacitor part CR2 (L1<L2). The first capacitor part CR1 having the lower ESL than that of the second capacitor part CR2 is disposed adjacent to a mounting surface of a circuit board in such a way that a current path in the capacitor becomes shorter and an ESL of the whole multilayer chip capacitor 200 becomes lower, particularly in a high frequency region. Accordingly, not only it is possible to embody uniform impedance characteristics in a wide frequency band but also the ESL of the whole multilayer chip capacitor 200 in a high frequency band is maintained to be lower (refer to FIG. 33). The multilayer chip capacitor 200 advantageous to embody a low ESL may be used as a decoupling capacitor for an MPU package.

Figure 21:
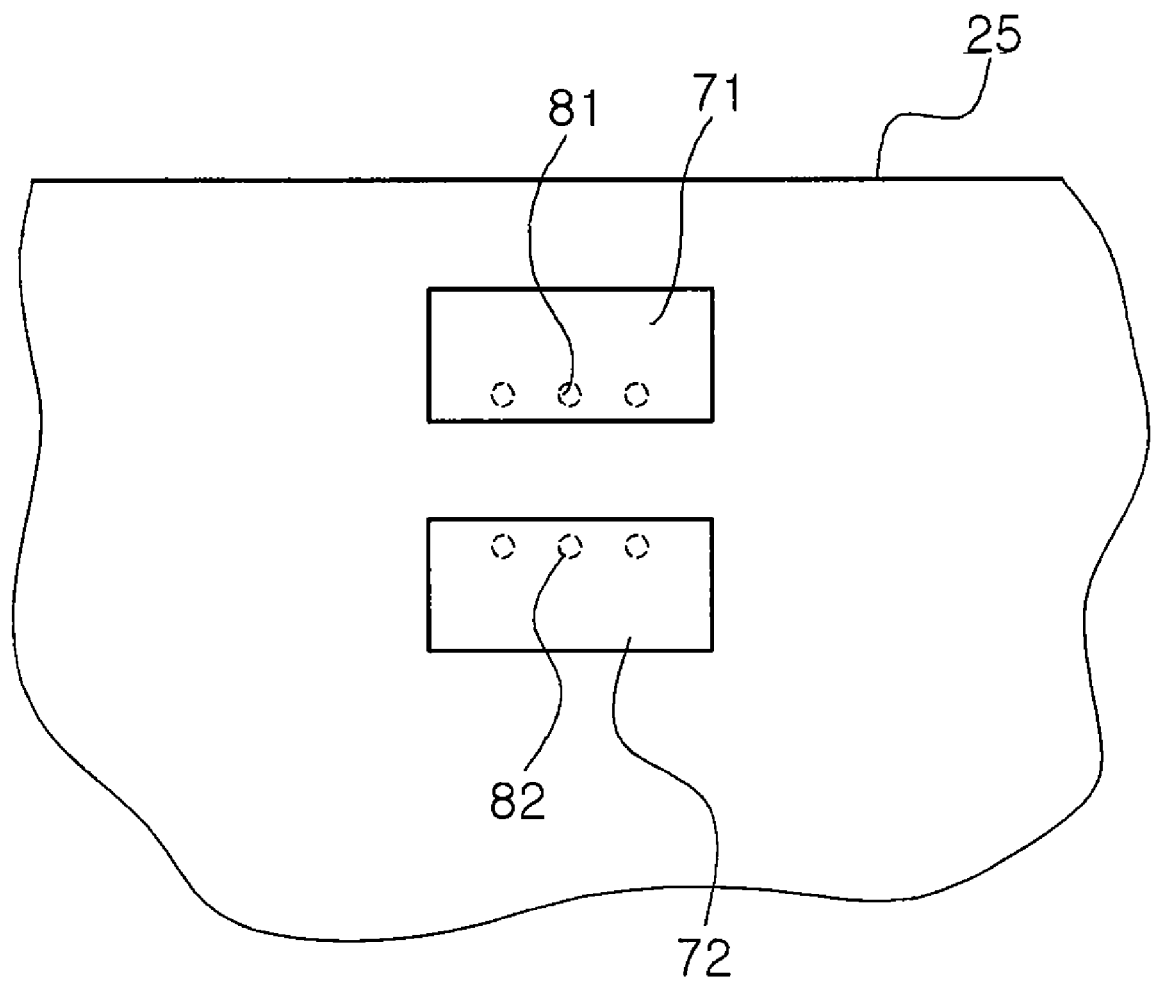
FIG. 21 is a top view illustrating an example of a circuit board where the multilayer chip capacitor of FIG. 17 is mounted.

FIG. 21 is a diagram illustrating an example of a circuit board for mounting the multilayer chip capacitor 200 of FIG. 17. Referring to FIG. 21, a circuit board 25 includes a first and second pad 71 and 72 to which the first and second outer electrodes 231 and 232 are connected. External circuits such as vias 81 and 82 are connected to the first and second pads 71 and 72, respectively. Accordingly, the equivalent circuit shown in FIG. 6 may be obtained. An effect of series resistance addition to the capacitor part CR2 by connection conductor lines 241 and 242 or actually controlling a resistance of the second capacitor part CR2 may be obtained (refer to Equation 1).

Figure 22:
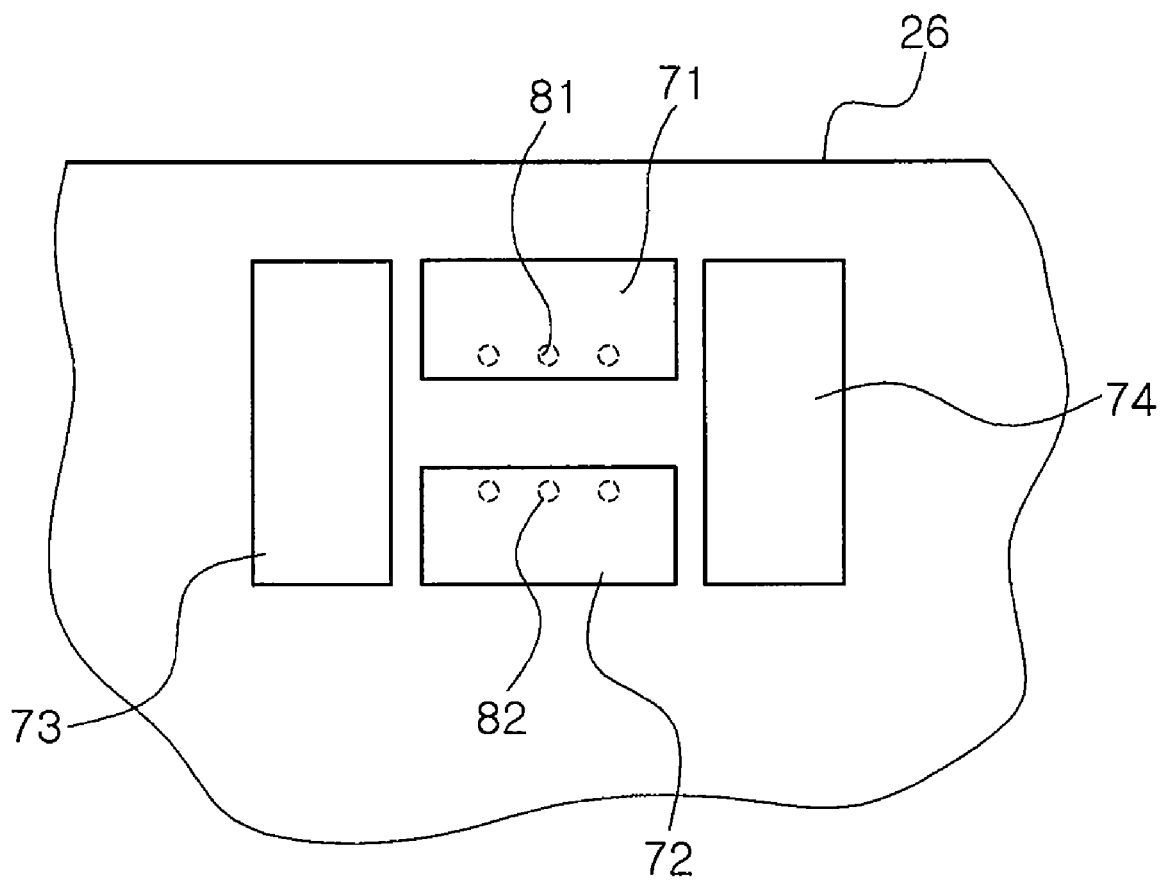
FIG. 22 is a top view illustrating another example of the circuit board where the multilayer chip capacitor of FIG. 17 is mounted.

To mount the multilayer chip capacitor 200, instead of the circuit board 25, a circuit board 26 of FIG. 22 may be used. Additional floated pads 73 and 74 not directly connected to external circuits may be connected to the third and fourth outer electrodes 233 and 234.

Figure 23:
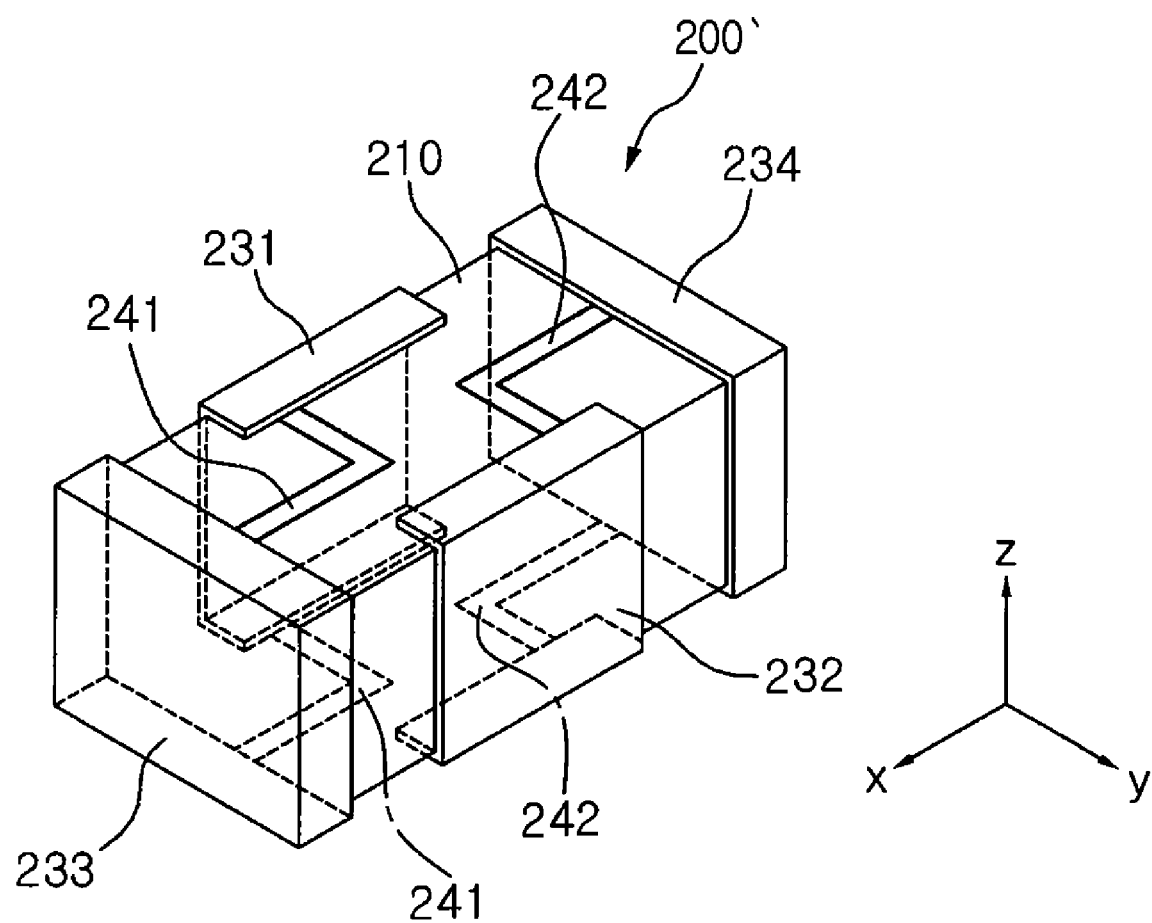
FIG. 23 is a perspective view illustrating a modified example of the multilayer chip capacitor of FIG. 17.
Figure 24:
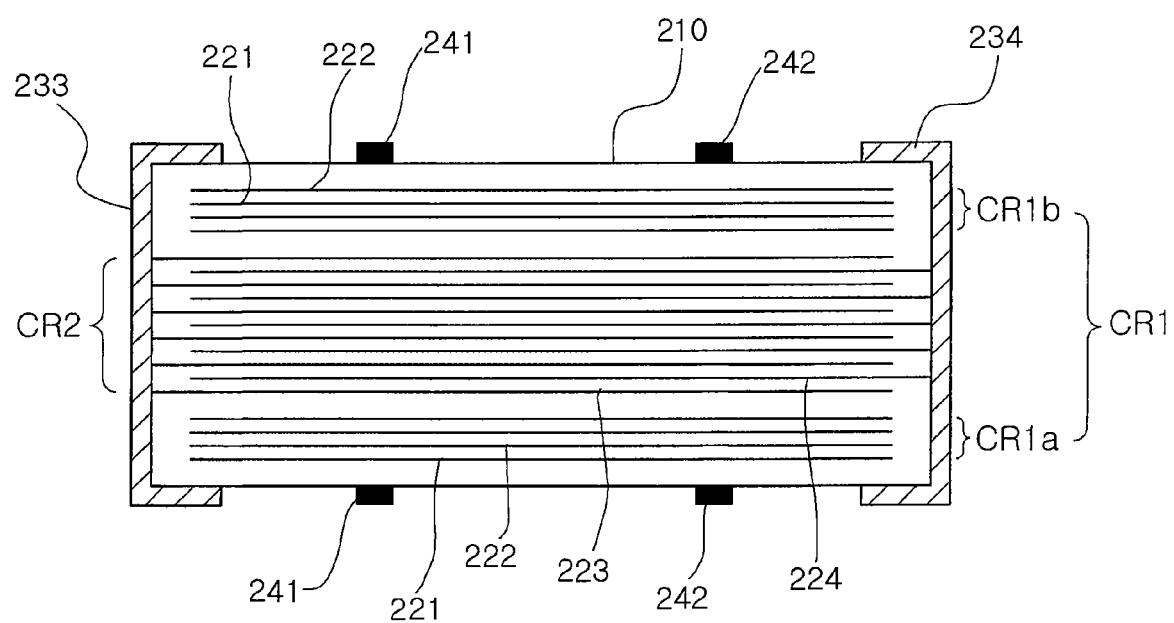
FIG. 24 is a cross-sectional view illustrating the multilayer chip capacitor of FIG. 23.

FIG. 23 is a perspective view illustrating a modified example of the multilayer chip capacitor 200 of FIG. 17. FIG. 24 is a cross-sectional view illustrating a multilayer chip capacitor 200' of FIG. 23. The multilayer chip capacitor 200' is obtained by forming the inner and outer structures of the multilayer chip capacitor 200 of FIG. 21 to have top and bottom symmetry. That is, as shown in FIGS. 23 and 24, the connection conductor lines 241 and 242 are formed on a top surface and a bottom surface of the outside of the capacitor body 210, respectively. In the capacitor body 210, two first capacitor parts CR1a and CR1b are disposed on a top and a bottom and a second capacitor part CR2 is disposed therebetween. An inner electrode structure of each of the capacitor parts CR1 and CR2 is identical to that shown in FIG. 20.

Figure 25:
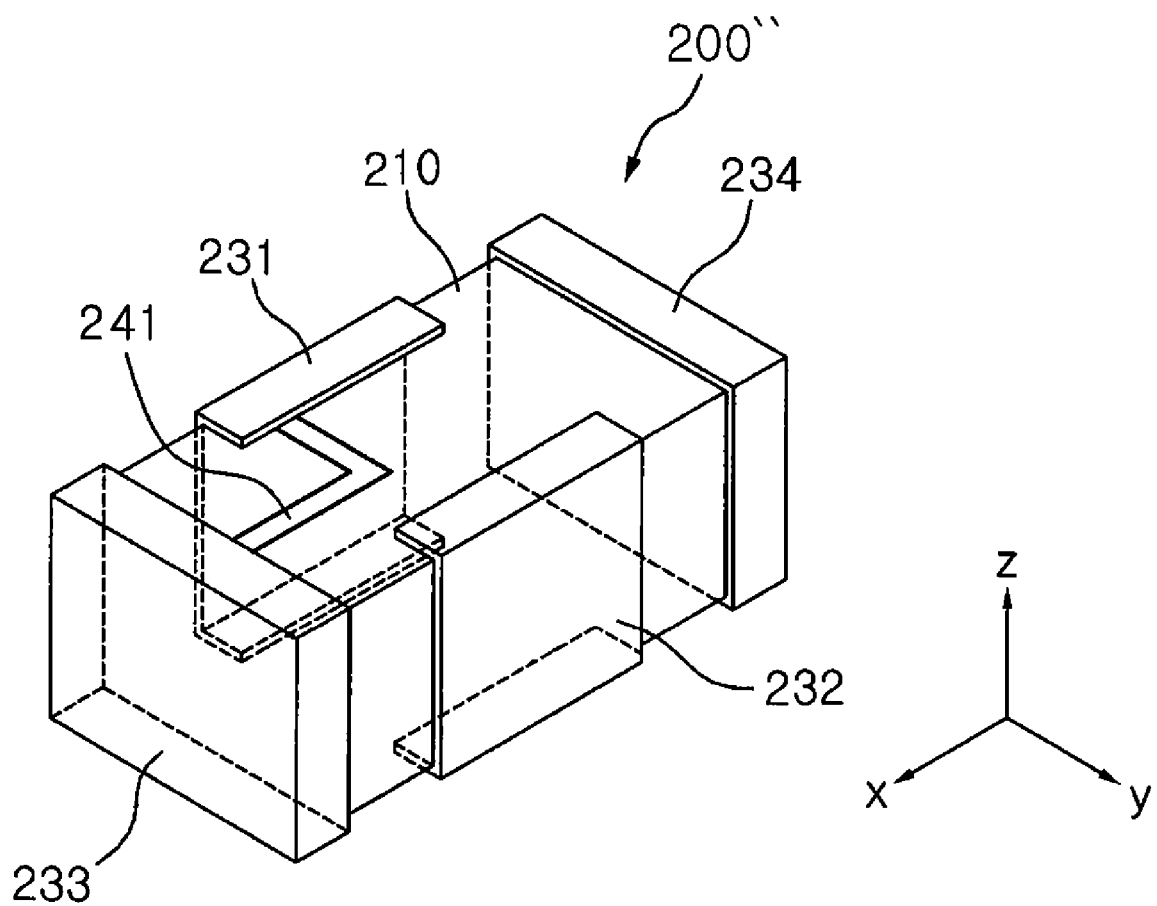
FIG. 25 is a perspective view illustrating another modified example of the multilayer chip capacitor of FIG. 17.
Figure 26:
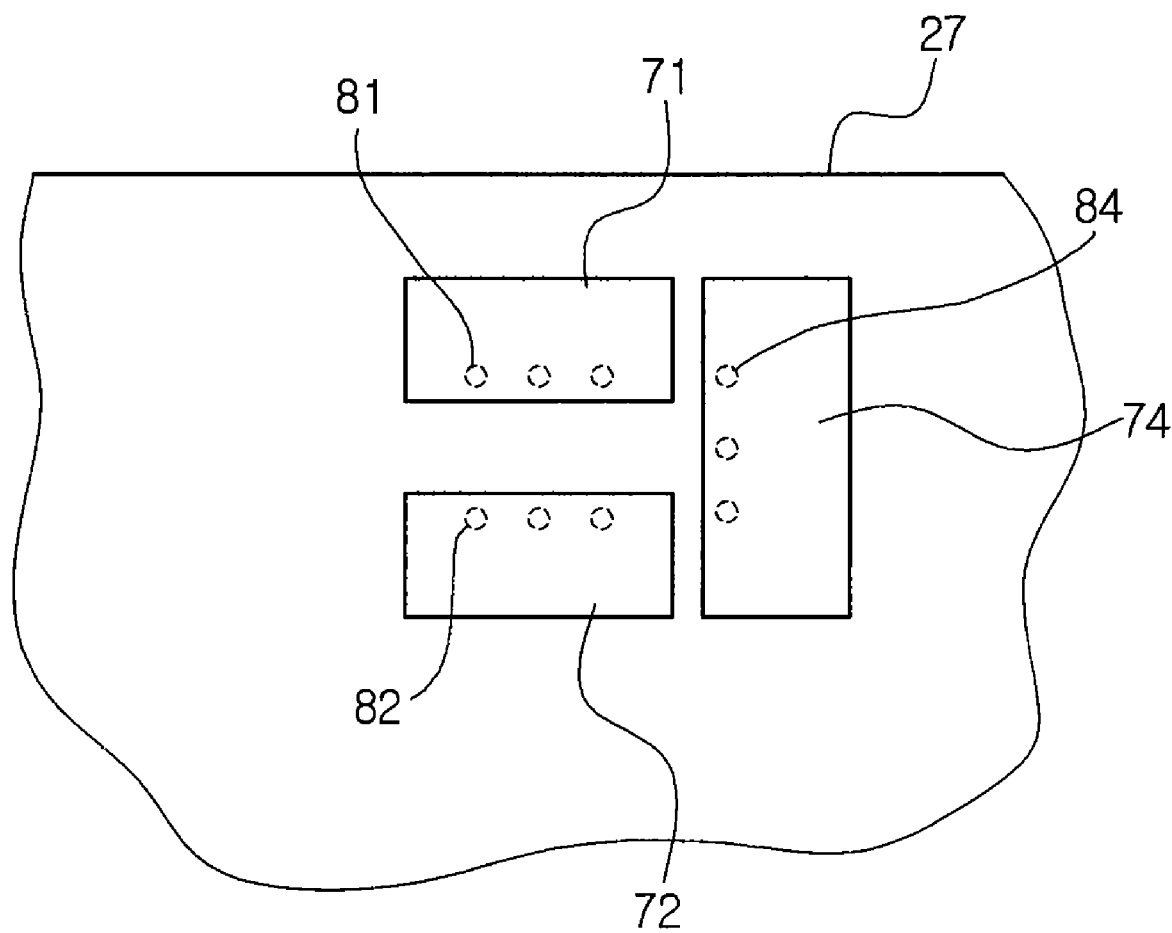
FIG. 26 is a top view illustrating an example of a circuit board where the multilayer chip capacitor of FIG. 25 is mounted.
Figure 27:
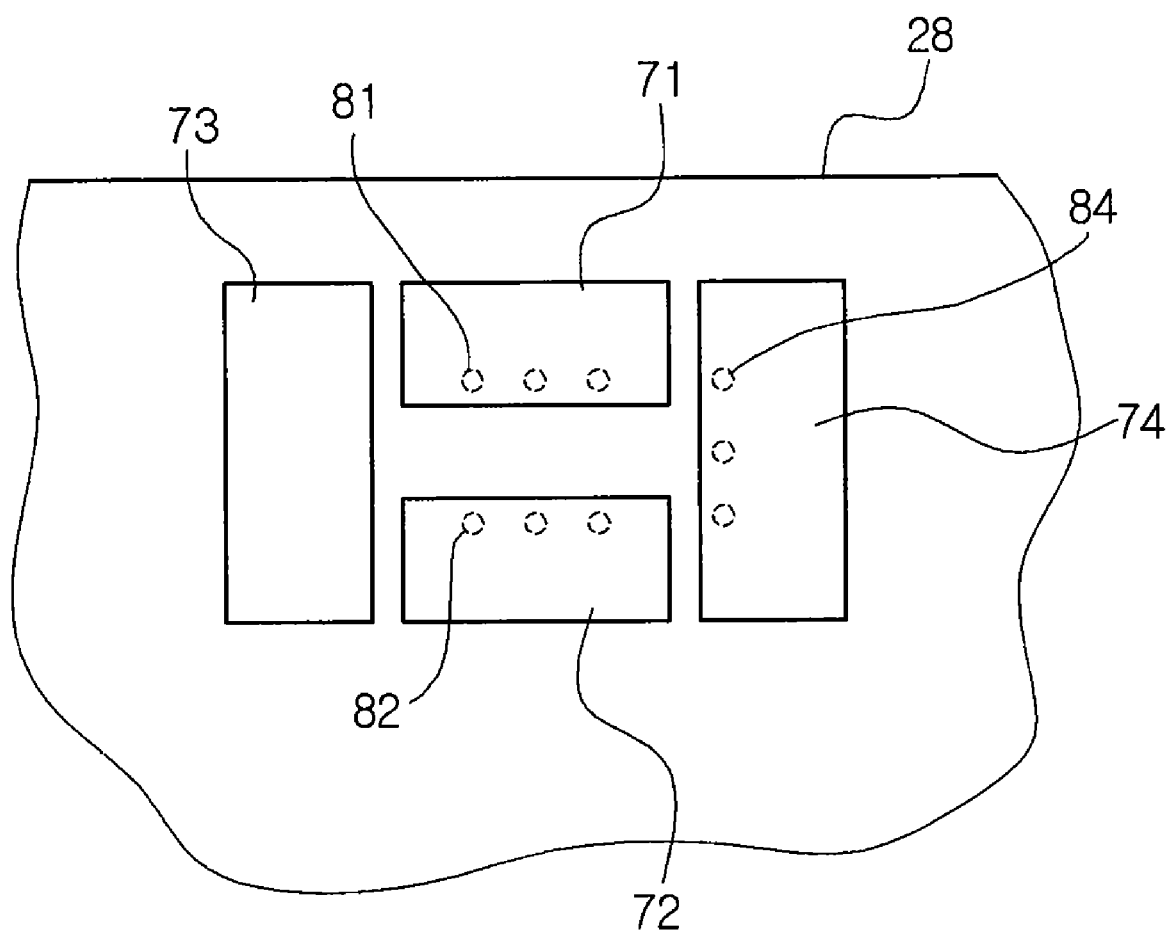
FIG. 27 is a top view illustrating another example of the circuit board where the multilayer chip capacitor of FIG. 25 is mounted.

FIG. 25 is a perspective view illustrating another modified example of the multilayer chip capacitor 200 of FIG. 17. FIGS. 26 and 27 are top views illustrating examples of a circuit board for mounting a multilayer chip capacitor 200" of FIG. 25.

The multilayer chip capacitor 200" of FIG. 25 is obtained by omitting the second connection conductor line 242 from the multilayer chip capacitor 200 of FIG. 17. The first outer electrode 231 and the third outer electrode 233 may be connected to each other via the connection conductor line 241. The second outer electrode 232 and the fourth outer electrode 234 may not be connected to each other via a connection conductor line. In this case, as shown in FIG. 26, to mount the multilayer chip capacitor 200", a circuit board 27 including the pads 71, 72, and 74 connected to the first, second, and fourth outer electrodes 231, 232, and 234, respectively, may be used. External circuits such as vias 81, 82, and 84 may be directly connected to the pads 71, 72, and 74, respectively.

On the other hand, as shown in FIG. 27, to mount the multilayer chip capacitor 200", an additional floated pad 73 may be further installed. However, a via is not directly connected to the floated pad 73. Using one of the circuit boards 27 and 28 of FIGS. 26 and 27, the first, second, and fourth pads 71, 72, and 74, that is, the first, second, and fourth outer electrodes 231, 232, and 234 are directly connected to external circuits such as vias but a third pad 73, that is, the third outer electrode 233 is connected to an external circuit via the connection conductor line 241.

The multilayer chip capacitor 200" may be manufactured to have inner and outer structures in which a top is symmetrical to a bottom by additionally installing the connection conductor line 241 to a bottom surface and forming the inner structure identical to that shown in FIG. 24.

Figure 28:
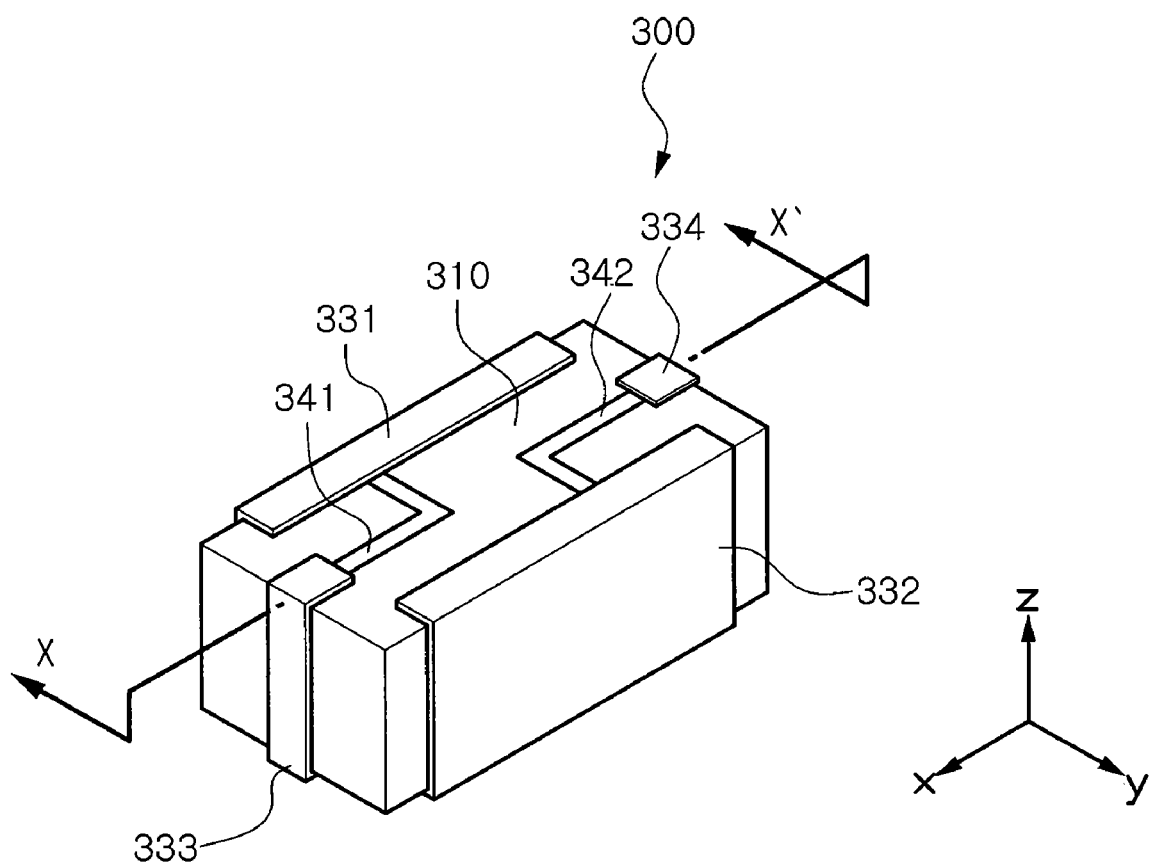
FIG. 28 is a perspective view illustrating a multilayer chip capacitor according to still another embodiment of the present invention.
Figure 29:
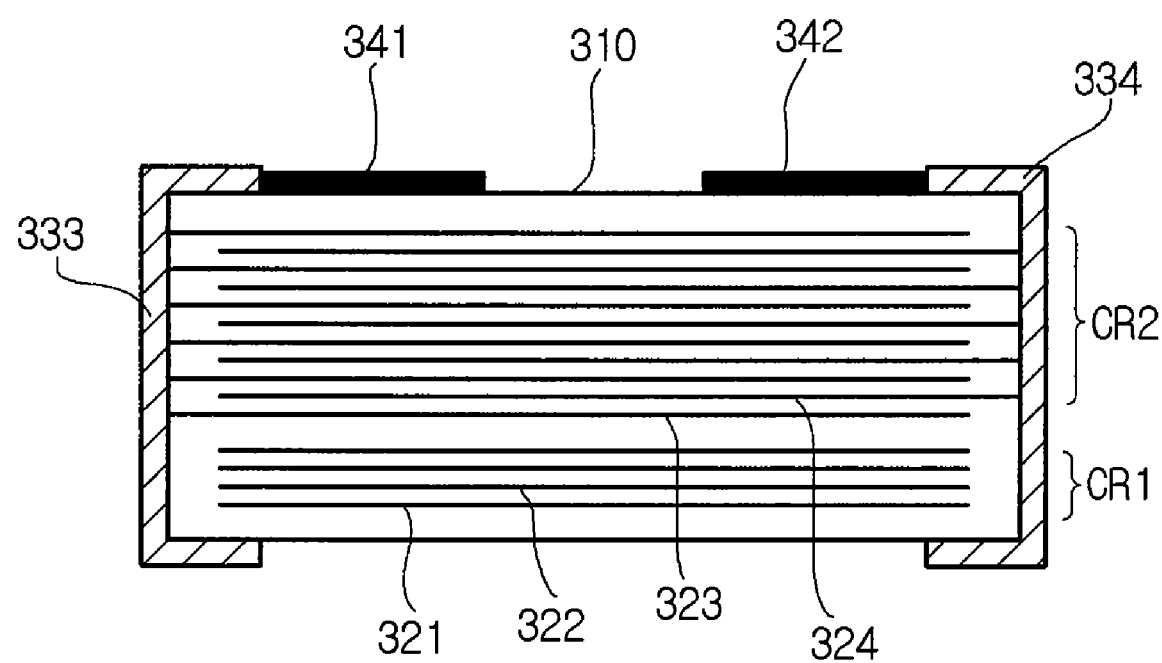
FIG. 29 is a cross-sectional view illustrating the multilayer chip capacitor of FIG. 28, cut along a line XX'.
Figures 30A, 30B:
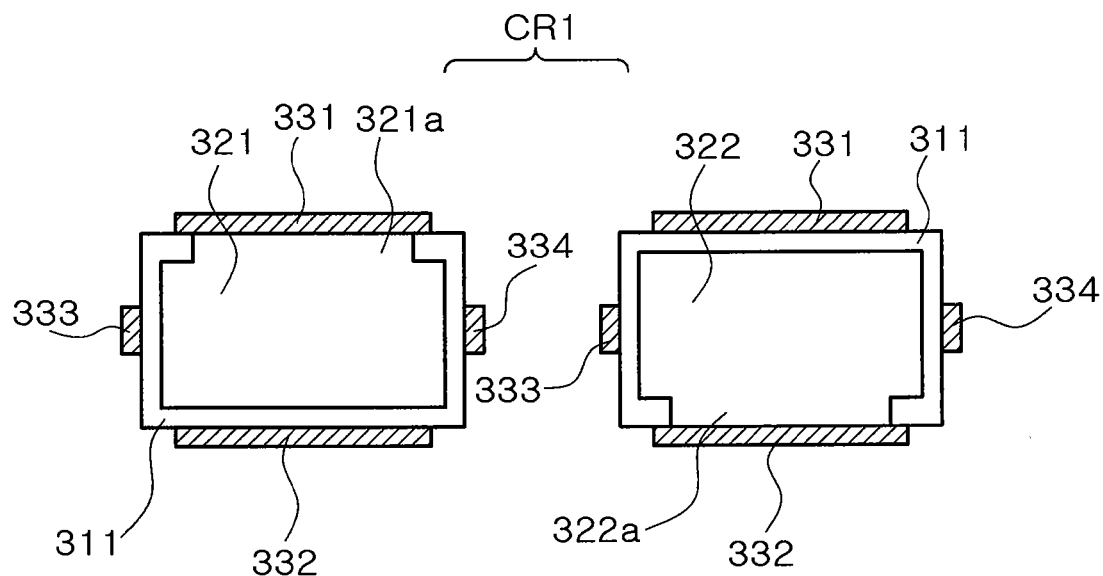
FIGS. 30A to 30D are vertical cross-sectional views illustrating inner electrode structures of the multilayer chip capacitor of FIG. 28.
Figures 30C, 30D:
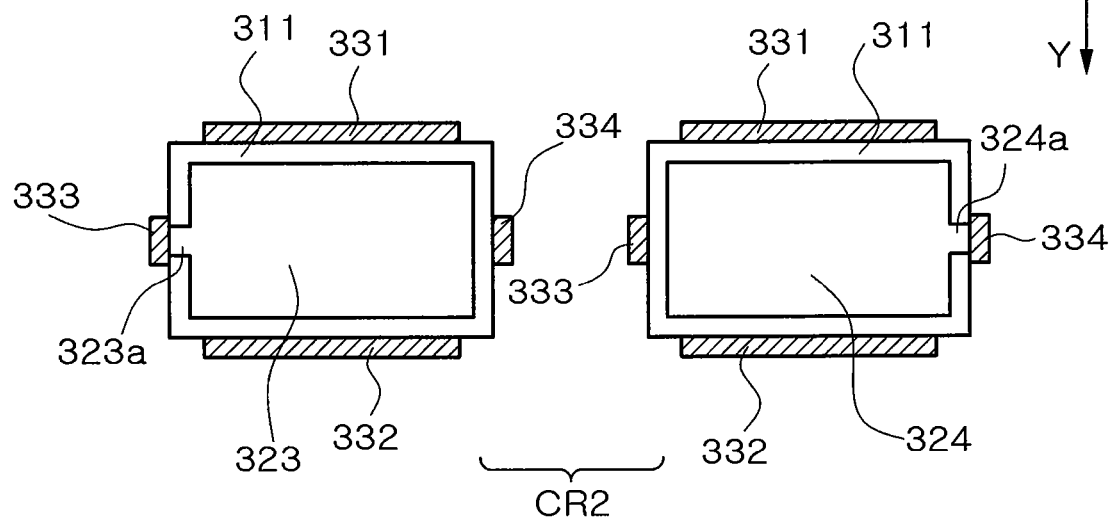

FIG. 28 is a perspective view illustrating a multilayer chip capacitor 300 according to still another embodiment of the present invention. FIG. 29 is a cross-sectional view illustrating the multilayer chip capacitor 300 cut along a line XX'. FIGS. 30A to 30D are vertical cross-sectional views illustrating inner electrode structures.

In the multilayer chip capacitor 300, first and second outer electrodes 331 and 332 are formed through most of a length of a longer side surface of a capacitor body 310 to cover the longer side surface and third and fourth outer electrodes 333 and 334 partially cover a shorter side surface of the capacitor body 310. In the inner structure, as shown in FIGS. 29 and 30A to 30D, first and second inner electrodes 321 and 322 of a first capacitor part CR1 at a bottom are connected to the first and second outer electrodes 331 and 332, in contact with the first and second outer electrodes 331 and 332, via leads 321a and 322a, Third and fourth inner electrodes 323 and 324 of a second capacitor part CR2 at a top are connected to the third and fourth outer electrodes 333 and 334, in contact with the third and fourth outer electrodes 333 and 334, via leads 323a and 324a.

In the present embodiment, since the first and second outer electrodes 331 and 332 are disposed at longer side surfaces and a width of the leads 321a and 322a is extended to most of a length of the longer side surface, an ESL of the first capacitor part CR1 becomes particularly low. The low ESL of the first capacitor part CR1 disposed adjacent to a mounting surface of a circuit board allows an ESL of the whole multilayer chip capacitor 300 to be more reduced. When necessary, the width of the leads 321a and 322a of the first and second inner electrodes 321 and 322 may be extended to a length of an overall longer side of a main part of the first and second inner electrodes 321 and 322.

Figure 31:
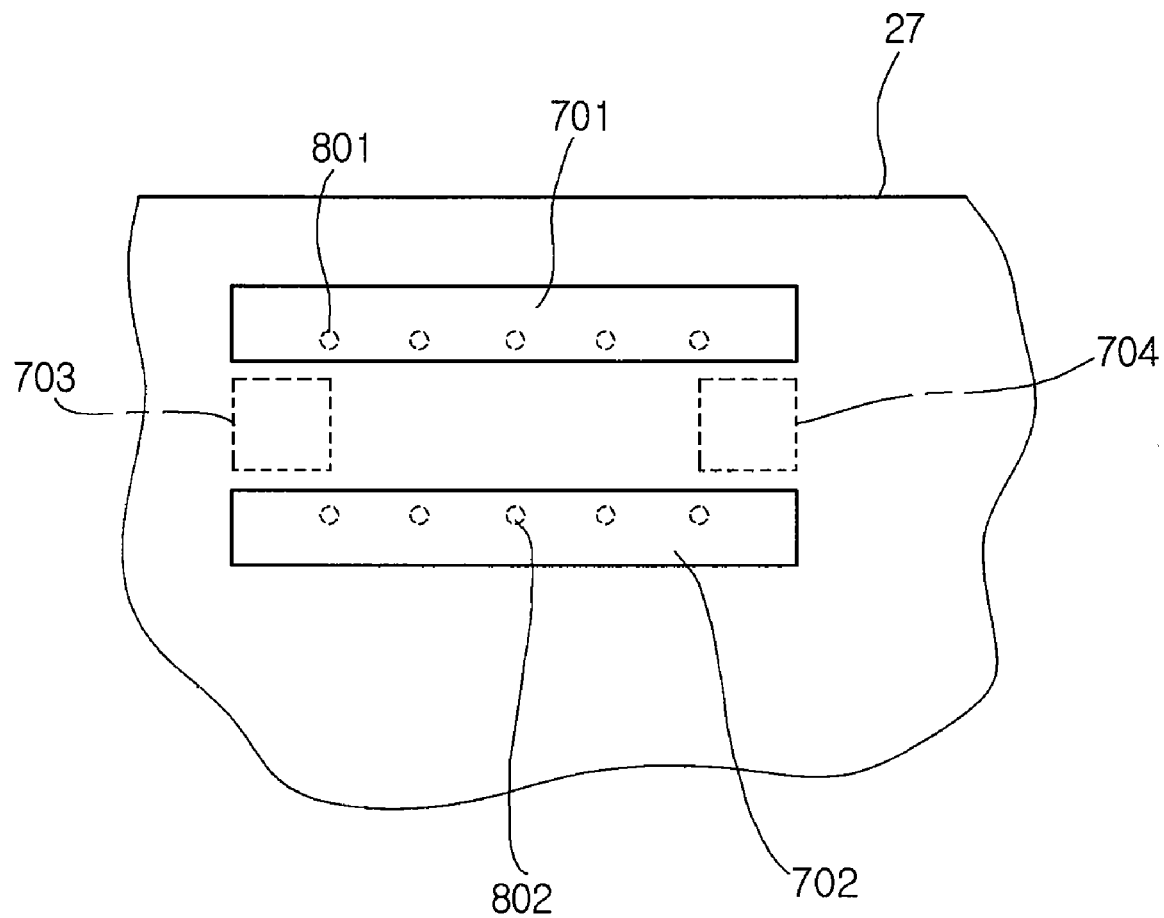
FIG. 31 is a top view illustrating an example of a circuit board where the multilayer chip capacitor of FIG. 28 is mounted.

To mount the capacitor 300 of FIG. 28, a circuit board 27 shown in FIG. 31 may be used. Vias 801 and 802 as external circuits are connected to first and second pads 701 and 702 connected to the first and second outer electrodes 331 and 332, respectively. One or more of third and fourth pads 703 and 704 additionally floated may be further installed to be used (refer to a dotted line).

The embodiment shown in FIG. 28 may be changed into inner and outer structures with top and bottom symmetrical to each other by additionally installing the connection conductor line 341 to a bottom and forming the inner structure with top and bottom symmetrical to each other.

INVENTIVE EXAMPLES

Inventive Example 1

Figure 32:
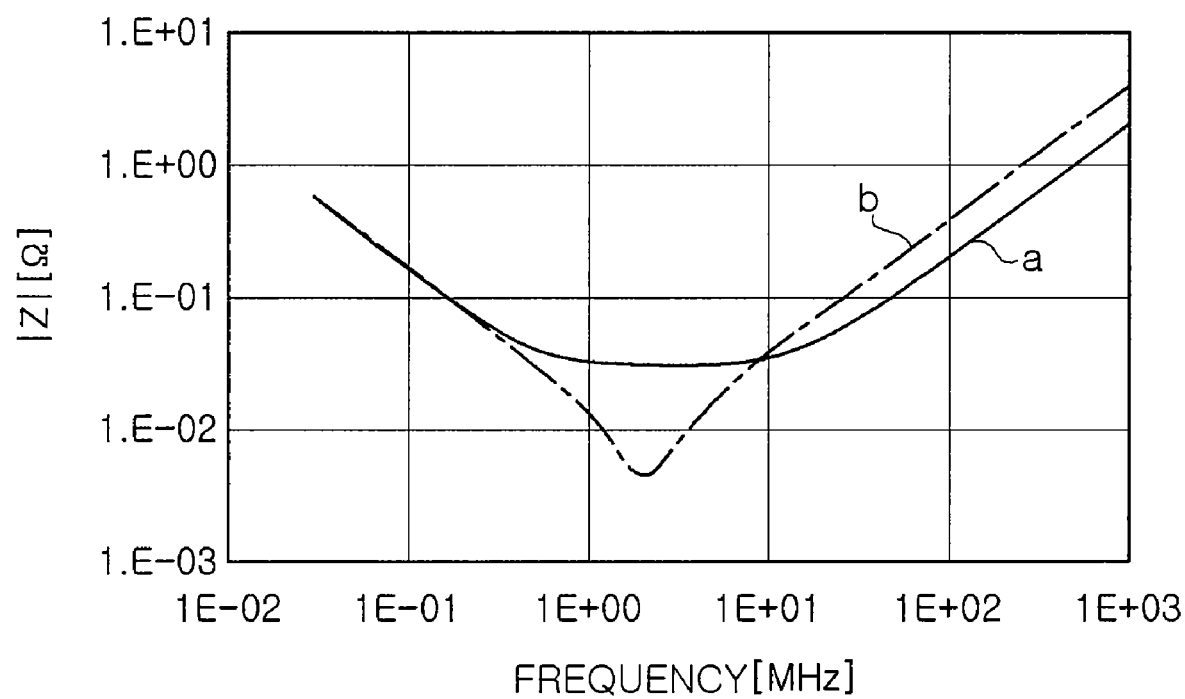
FIG. 32 is a graph illustrating frequency-to-impedance characteristics of the multilayer chip capacitor according to an embodiment of the present invention and a general multilayer chip capacitor according to a comparative example.

FIG. 32 is a graph illustrating frequency-to-impedance characteristics of multilayer chip capacitors according to inventive example 1 and a comparative example. An impedance curve a of the multilayer chip capacitor according to the inventive example 1 shows a result of experiments of measuring a frequency and an impedance of the multilayer chip capacitor 100 and the circuit board device of FIGS. 1 to 5.

Particularly, the inventive example 1 corresponds to a multilayer chip capacitor of a four-terminal capacitor with a capacitance of 10 μF and a size of 1608 (1.6 mm×0.8 mm). A capacitance of a first capacitor part is 1.73 μF, and a capacitance of a second capacitor part is 8.27 μF. Also, an ESL and an ESR of the first capacitor part are 350 pH and 38 mΩ, respectively. Actual ESL and ESR of conduction conductor lines and the whole second capacitor part (L2' and R2' of FIG. 6) are 2200 pH and 40 mΩ, respectively. As described above, regardless of a great capacitance difference between the first and second capacitor parts, the second capacitor part has an ESR equal to an ESR of the first capacitor part is embodied by adding connection conductor lines in series. A frequency-to-impedance characteristic curve b of the comparative example shows a result of measuring a conventional capacitor that is a two-terminal capacitor with a capacitance of 10 μF and a size of 1608. The capacitor is not divided into two capacitor parts and has a structure of repeatedly laminated inner electrodes having a different polarity from each other and alternately connected to only two external electrodes.

Averaged ESLs and minimum impedances (Min|Z|) of the comparative example and the inventive example 1 are shown in following Table 1.

TABLE 1

| Samples | ESL (average, SRF-3 GHz) | Min \|Z\| |
|---|---|---|
| Comparative example (b) | 578 pH | 4.5 mΩ |
| Inventive example (a) | 301 pH | 30.1 mΩ |

As shown in FIG. 32, in the case of the inventive example 1, the impedance curve is flat in a wide frequency region around a resonating frequency. This shows that the impedance has a uniform value without sudden change and is notably stable in a relative wider frequency band. On the other hand, in the case of the comparative example, the impedance has a sudden change around a resonating frequency area, thereby forming a sharp smallest point in the frequency-impedance curve b. Also, in a high frequency band, the inventive example 1 has a lower impedance than that of the comparative example.

Inventive Example 2

Figure 33:
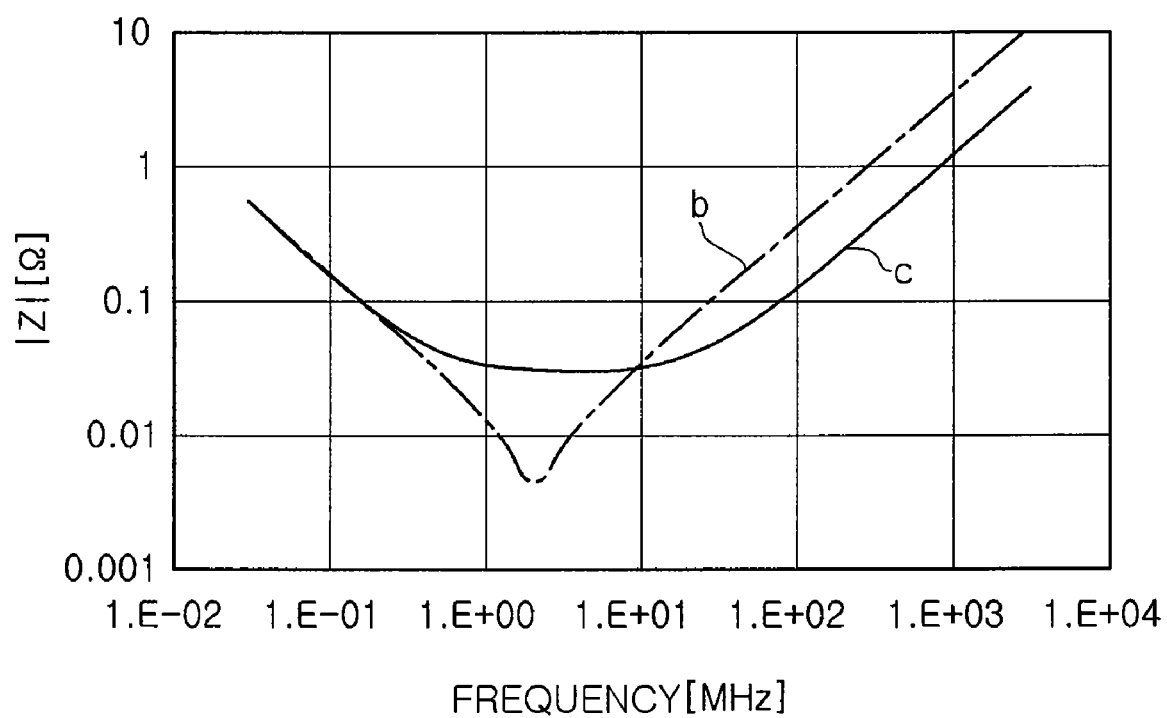
FIG. 33 is a graph illustrating frequency-to-impedance characteristics of the multilayer chip capacitor according to another embodiment of the present invention and the multilayer chip capacitor according to the comparative example.

FIG. 33 is a graph illustrating frequency-to-impedance characteristics of multilayer chip capacitors according to inventive example 2 and the comparative example. An impedance curve c of the multilayer chip capacitor according to the inventive example 2 shows a result of experiments of measuring a frequency and an impedance of the multilayer chip capacitor 200 and the circuit board device of FIGS. 17 to 21.

Particularly, the inventive example 2 corresponds to a multilayer chip capacitor of a four-terminal capacitor with a capacitance of 10 μF and a size of 1608 (1.6 mm×0.8 mm). A capacitance of a first capacitor part is 0.52 μF, and a capacitance of a second capacitor part is 9.48 μF. Also, an ESL and an ESR of the first capacitor part are 300 pH and 60 mΩ, respectively. Actual ESL and ESR of conduction conductor lines and the whole second capacitor part (L2' and R2' of FIG. 6) are 700 pH and 35 mΩ, respectively.

Averaged ESLs and minimum impedances (Min|Z|) of the comparative example and the inventive example 2 are shown in following Table 2.

TABLE 2

| Samples | ESL (average, SRF-3 GHz) | Min \|Z\| |
|---|---|---|
| Comparative example (b) | 578 pH | 4.5 mΩ |
| Inventive example (c) | 213 pH | 31.1 mΩ |

As shown in FIG. 33, in the case of the inventive example 2, the impedance curve c is flat in a wide frequency region around a resonating frequency, in which a uniform impedance of about 31 mΩ is shown in a flat portion. This shows that the impedance has a uniform value without sudden change and is notably stable in a relative wider frequency band (compare with the curve b of the comparative example). Also, in a high frequency band, the inventive example 2 has a lower impedance than that of the comparative example.

While the present invention has been shown and described in connection with the exemplary embodiments, it will be apparent to those skilled in the art that modifications and variations can be made without departing from the spirit and scope of the invention as defined by the appended claims.

What is claimed is:

1. A multilayer chip capacitor comprising:
   a capacitor body having a lamination structure where a plurality of dielectric layers are laminated and including a first capacitor part and a second capacitor part arranged according to a lamination direction;
   first to fourth outer electrodes formed on side surfaces of the capacitor body, the first and third outer electrodes having the same polarity and the second and fourth outer electrodes having the same polarity opposite to that of the first outer electrode; and
   one or more connection conductor lines formed on an outer surface of the capacitor body and connecting the first outer electrode to the third outer electrode or connecting the second outer electrode to the fourth outer electrode,
   wherein the first capacitor part comprises first and second inner electrodes alternately disposed to be opposite to each other, interposing the dielectric layer therebetween in the capacitor body;
   the second capacitor part comprises a plurality of third and fourth inner electrodes alternately disposed to be opposite to each other, interposing the dielectric layer therebetween in the capacitor body; and
   the first outer electrode is connected to the first inner electrode, the second outer electrode is connected to the second inner electrode, the third outer electrode is connected to the third inner electrode, and the fourth outer electrode is connected to the fourth inner electrode.

2. The multilayer chip capacitor of claim 1, wherein a total number of a lamination of the third and fourth inner electrodes in the second capacitor part is greater than a total number of a lamination of the first and second inner electrodes in the first capacitor part.

3. The multilayer chip capacitor of claim 1, wherein an ESR (Equivalent Series Resistance) of the first capacitor part is greater than an ESR of the second capacitor part.

4. The multilayer chip capacitor of claim 3, wherein an ESL (Equivalent Series Inductance) of the first capacitor is smaller than an ESL of the second capacitor part.

5. The multilayer chip capacitor of claim 1, wherein the first capacitor part is located at one of both ends of the lamination direction.

6. The multilayer chip capacitor of claim 5, wherein the connection conductor line is disposed at one of a top surface and a bottom surface of the capacitor body.

7. The multilayer chip capacitor of claim 1, wherein two of the first capacitor parts are disposed at both ends of the lamination direction, and
the second capacitor part is disposed between the two first capacitor parts.

8. The multilayer chip capacitor of claim 7, wherein the connection conductor line is disposed at a top surface and a bottom surface of the capacitor body.

9. The multilayer chip capacitor of claim 8, wherein the first capacitors at the both ends are symmetrically disposed to each other, and
the multilayer chip capacitor has top and bottom symmetry.

10. The multilayer chip capacitor of claim 1, wherein the one or more connection conductor lines comprises:
a first connection conductor line connecting the first outer electrode to the third outer electrode; and
a second connection conductor line connecting the second outer electrode to the fourth outer electrode.

11. The multilayer chip capacitor of claim 1, wherein the one or more connection conductor lines comprises one of:
a first connection conductor line connecting the first outer electrode to the third outer electrode; and
a second connection conductor line connecting the second outer electrode to the fourth outer electrode.

12. The multilayer chip capacitor of claim 1, wherein a resistance directly added to the second capacitor part is capable of being controlled by changing one or more of conductivity, a length, a width, and a thickness of the connection conductor line.

13. The multilayer chip capacitor of claim 1, wherein the connection conductor line is formed of one of a thick resistor and a thin resistor.

14. The multilayer chip capacitor of claim 1, wherein the multilayer chip capacitor is a four-terminal capacitor comprising the first to fourth outer electrodes one by one, respectively.

15. The multilayer chip capacitor of claim 14, wherein the first and second outer electrodes are disposed at shorter side surfaces of the capacitor body, opposite to each other, and
the third and fourth outer electrodes are disposed at longer side surfaces of the capacitor body, opposite to each other.

16. The multilayer chip capacitor of claim 14, wherein the first and second outer electrodes are disposed at longer side surfaces of the capacitor body, opposite to each other, and
the third and fourth outer electrodes are disposed at shorter side surfaces of the capacitor body, opposite to each other.

17. The multilayer chip capacitor of claim 14, wherein the first and second inner electrodes are connected to the first and second outer electrodes via leads, and
an ESR of the first capacitor part is capable of being controlled by changing widths of the leads of the first and second inner electrodes.

18. The multilayer chip capacitor of claim 14, wherein the third and fourth inner electrodes are connected to the third and fourth outer electrodes via leads, and
an ESR of the second capacitor part is capable of being controlled by changing widths of the leads of the third and fourth inner electrodes.

19. A circuit board device comprising:
the multilayer chip capacitor of claim 1; and
a circuit board comprising a mounting surface where the multilayer chip capacitor is mounted and an external circuit electrically connected to the multilayer chip capacitor,
wherein a plurality of pads connected to the outer electrodes of the multilayer chip capacitor is formed and the first capacitor part is disposed to be closer to the mounting surface than the second capacitor part in the multilayer chip capacitor;
the plurality of pads comprises a first pad connected to the first outer electrode and a second pad connected to the second outer electrode; and
the first and second pads are directly connected to the external circuit.

20. The circuit board device of claim 19, wherein an ESR of the first capacitor part is greater than an ESR of the second capacitor part.

21. The circuit board device of claim 19, wherein, vias connected to the first and second pads are formed in the circuit board, as a portion of the external circuit.

22. The circuit board device of claim 21, wherein the via connected to the first pad is disposed adjacent to the second pad, and
the via connected to the second pad is disposed adjacent to the first pad.

23. The circuit board device of claim 21, wherein two or more of the vias are connected to each of the first and second pads, respectively.

24. The circuit board device of claim 19, wherein the one or more of connection conductor lines comprise a first connection conductor line connecting the first outer electrode to the third outer electrode and a second connection conductor line connecting the second outer electrode to the fourth outer electrode, and
the third and fourth outer electrodes are connected to the external circuit via the first and second connection conductor lines.

25. The circuit board device of claim 24, wherein the plurality of pads further comprises a third pad connected to the third outer electrode and a fourth pad connected to the fourth outer electrode.

26. The circuit board device of claim 19, wherein the one or more connection conductor lines comprise one of a first connection conductor line connecting the first outer electrode to the third outer electrode and a second connection conductor line connecting the second outer electrode to the fourth outer electrode.

27. The circuit board device of claim 26, wherein the one or more connection conductor lines comprise only the first connection conductor line,
the plurality of pads further comprises a pad connected to the fourth outer electrode, and
the pad connected to the fourth outer electrode is directly connected to the external circuit.

28. The circuit board device of claim 27, wherein vias connected to the pad connected to the fourth outer electrode, the first pad, and the second pad are formed in the circuit board, as a portion of the external circuit.

29. The circuit board device of claim 26, wherein the one or more connection conductor lines comprise only the second connection conductor line,
   the plurality of pads further comprises a pad connected to the third outer electrode, and
   the pad connected to the third outer electrode is directly connected to the external circuit.

30. The circuit board device of claim 29, wherein vias connected to the pad connected to the third outer electrode, the first pad, and the second pad are formed in the circuit board, as a portion of the external circuit.

31. The circuit board device of claim 19, wherein the multilayer chip capacitor is a four-terminal capacitor comprising the first to fourth outer electrodes one by one, respectively, and
   the first and second outer electrodes are disposed at shorter side surfaces of the capacitor body, opposite to each other, and the third and fourth outer electrodes are disposed at longer side surfaces of the capacitor body, opposite to each other.

32. The circuit board device of claim 19, wherein the multilayer chip capacitor is a four-terminal capacitor comprising the first to fourth outer electrodes one by one, respectively, and
   the first and second outer electrodes are disposed at longer side surfaces sides of the capacitor body, opposite to each other, and the third and fourth outer electrodes are disposed at shorter side surfaces of the capacitor body, opposite to each other.

33. The circuit board device of claim 19, wherein the multilayer chip capacitor mounted on the circuit board has impedance characteristics having a flat portion in a frequency-impedance curve.

* * * * *